(12) United States Patent
Urashima et al.

(10) Patent No.: US 7,889,509 B2
(45) Date of Patent: Feb. 15, 2011

(54) CERAMIC CAPACITOR

(75) Inventors: Kazuhiro Urashima, Konan (JP); Shinji Yuri, Kasugai (JP); Manabu Sato, Nagoya (JP); Yasuhiro Sugimoto, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 938 days.

(21) Appl. No.: 11/513,039

(22) Filed: Aug. 31, 2006

(65) Prior Publication Data

US 2007/0064375 A1  Mar. 22, 2007

(30) Foreign Application Priority Data

Sep. 1, 2005 (JP) ............................ P2005-254030
Apr. 14, 2006 (JP) ............................ P2006-112261

(51) Int. Cl.
*H05K 7/00* (2006.01)
(52) U.S. Cl. ........................ 361/760; 361/763; 257/723
(58) Field of Classification Search ................. 361/760, 361/763; 257/723
See application file for complete search history.

(56) References Cited

U.S. PATENT DOCUMENTS

| | | | |
|---|---|---|---|
| 6,346,743 B1 * | 2/2002 | Figueroa et al. | ............. 257/723 |
| 6,388,207 B1 | 5/2002 | Figueroa et al. | |
| 6,724,638 B1 | 4/2004 | Inagaki et al. | |
| 6,876,554 B1 | 4/2005 | Inagaki et al. | |
| 6,979,890 B2 | 12/2005 | Kambe et al. | |
| 7,002,075 B2 | 2/2006 | Kambe et al. | |
| 7,209,366 B2 * | 4/2007 | Prokofiev et al. | ............ 361/803 |
| 7,307,852 B2 | 12/2007 | Inagaki et al. | |
| 7,345,246 B2 * | 3/2008 | Muramatsu et al. | ......... 174/260 |
| 2002/0027282 A1 | 3/2002 | Kawakami et al. | |

(Continued)

FOREIGN PATENT DOCUMENTS

JP  5-36857 A  2/1993

(Continued)

*Primary Examiner*—Tuan T Dinh
*Assistant Examiner*—Andargie M Aychillhum
(74) *Attorney, Agent, or Firm*—Sughrue Mion, PLLC

(57) ABSTRACT

A circuit board (10, 10'', 10''') comprising: a board core (11) having a main core surface (12) and a rear core surface (13); a ceramic capacitor (101, 101', 101'', 101''', 101'''', 101''''', 101'''''') having a main capacitor surface (102) and a rear capacitor surface (103), having a structure in which a first inner electrode layer (141) and a second inner electrode layer (142) are alternately stacked with a ceramic dielectric layer (105) interposed therebetween, and having a plurality of capacitor function units (107, 108) being electrically independent from each other, the ceramic capacitor (101, 101', 101'', 101''', 101'''', 101''''', 101'''''') being buried in the board core (11) in a state where the main core surface (12) and the main capacitor surface (102) are directed in a same direction; and a buildup layer (31) having a structure in which an interlayer insulating layer (33, 35) and a conductor layer (42) are alternately stacked on the main core surface (12) and the main capacitor surface (102) and having a semiconductor integrated circuit device mounting region (23, 51, 52) for mounting a semiconductor integrated circuit device (21, 53, 54) having a plurality of processor cores (24, 25) on a surface (39) of the buildup layer (31), wherein the plurality of capacitor function units (107, 108) are capable of being electrically connected to the plurality of processor cores (24, 25), respectively.

10 Claims, 15 Drawing Sheets

U.S. PATENT DOCUMENTS

| | | |
|---|---|---|
| 2004/0027813 A1 | 2/2004 | Li |
| 2004/0160751 A1* | 8/2004 | Inagaki et al. ............... 361/763 |
| 2004/0184219 A1* | 9/2004 | Otsuka et al. ............ 361/306.3 |
| 2005/0012217 A1* | 1/2005 | Mori et al. .................. 257/758 |
| 2005/0157478 A1* | 7/2005 | Inagaki et al. ............... 361/763 |
| 2007/0258225 A1 | 11/2007 | Inagaki et al. |
| 2008/0055872 A1 | 3/2008 | Inagaki et al. |
| 2008/0142255 A1 | 6/2008 | Inagaki et al. |
| 2008/0144298 A1 | 6/2008 | Inagaki et al. |
| 2008/0158838 A1 | 7/2008 | Inagaki et al. |
| 2008/0158841 A1 | 7/2008 | Inagaki et al. |
| 2008/0169120 A1 | 7/2008 | Inagaki et al. |

FOREIGN PATENT DOCUMENTS

| | | |
|---|---|---|
| JP | 2001-352141 A | 12/2001 |
| JP | 2002-43754 | 2/2002 |
| JP | 2003-178930 A | 6/2003 |
| JP | 2004-311990 A | 11/2004 |
| JP | 2005-39217 | 2/2005 |
| JP | 2005-39243 | 2/2005 |

\* cited by examiner

CERAMIC CAPACITOR

FIELD OF THE INVENTION

The present invention relates to a circuit board having a structure in which a ceramic capacitor is buried in a board core, a buildup layer is stacked on the surface thereof, and a semiconductor integrated circuit device is mounted thereon, and a ceramic capacitor used in the circuit board.

BACKGROUND OF THE INVENTION

With recent enhancement in speed and performance of semiconductor integrated circuit devices (IC chips) used in micro processors of computers and the like, the number of terminals tends to increase and the pitch between terminals tends to decrease accordingly. In general, a plurality of terminals is densely arranged in an array on the bottom surface of an IC chip and the terminal group is connected to the terminal group of a mother board in a flip chip manner. However, since the terminal group of the IC chip and the terminal group of the mother board are greatly different from each other in pitches between the terminals, a method of manufacturing a package in which the IC chip is mounted on an IC chip mounting circuit board and mounting the package on the mother board is employed. As the IC chip mounting circuit board constituting such a type of package, there has been suggested, for example, a circuit board in which a chip-shaped ceramic capacitor is buried in a core board made of a polymer material to form a core part and a buildup layer is formed on the front surface and the rear surface of the core part (for example, see JP-A-2005-39243).

Recently, there was a great need for a system having performance higher than that of a package mounted with only one micro processor and a package mounted with a "multi-core micro processor" was suggested as an example thereof. The multi-core micro processor is different from known micro processors, in that the known micro processor has only one processor core (operation processor) in one chip but the multi-core micro processor which is a next generation processor has a plurality of processor cores integrated on one chip. Accordingly, in the package having a multi-core micro processor structure, a plurality of threads (tasks) can be processed in a parallel manner, thereby enhancing the entire processing ability of a system. Obstacle resistance is also enhanced compared with a single-core micro processor. Therefore, it is possible to embody a high-performance system suitable for application to a server or a computer.

SUMMARY OF THE INVENTION

When an IC chip with the multi-core micro processor structure is mounted on an IC chip mounting circuit board described in JP-A-2005-39243, the following problems are caused. For example, when a plurality of processor cores can share a power supply system, there is a room to employ the IC chip mounting circuit board as a constituent component of a package with the multi-core micro processor. However, since the power supply system cannot be shared in general, it can be sufficiently predicted that different power supply systems should be established in the micro processors in many cases. In this case, even when the IC chip mounting circuit board is employed, it is not possible to satisfactorily operate the individual processor cores. Accordingly, it is not possible to draw out the merit of the multi-core micro processor structure to maximum, thereby not accomplishing the sufficient enhancement in performance.

A variety of circuit units such as an I/O circuit unit and a memory in addition to the processor core are provided in the IC chip. Accordingly, there may be a need for establishing individual power supply systems for the respective circuit units in the future. However, in practice, there has been specifically suggested no technique for coping with the need It is predicted that such a need will be remarkable with complication of the inner structure of the IC chip.

In such a type of package, since the amount of heat generated from the multi-core micro processor increases, it is very important that the thermal expansion coefficients of the multi-core micro processor and the circuit board are matched up with each other. That is, when the thermal expansion coefficients of the multi-core micro processor and the circuit board are not matched up with each other, a great thermal stress acts on the multi-core micro processor, thereby easily causing cracks or connection failures in the multi-core micro processor. Accordingly, it is necessary to employ a structure for reducing the affection of the thermal stress.

The present invention is contrived to solve the above-mentioned problems. An object of the invention is to provide a circuit board which can easily accomplish enhancement in performance, can be easily manufactured, has excellent cost property and reliability, since the ability of a semiconductor integrated circuit device can be drawn out to the maximum.

Another object of the invention is to provide a ceramic capacitor suitable for use in the circuit board.

According to an aspect (aspect 1) for achieving the above-mentioned object, there is provided a circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed there between, and having a plurality of capacitor function units electrically independent of each other, the ceramic capacitor being buried in the board core in a state where the main core surface and the main capacitor surface are directed in the same direction; and a buildup layer having a structure in which an interlayer insulating layer and a conductor layer are alternately stacked on the main core surface and the main capacitor surface and having a semiconductor integrated circuit device mounting region, which can be mounted with a semiconductor integrated circuit device having a plurality of processor cores, set on the surface thereof, wherein the plurality of capacitor function units can be electrically connected to the plurality of processor cores, respectively.

Accordingly, in the circuit board according to aspect 1, even when a plurality of processor cores cannot share a power supply system and different power supply systems should be provided to the process cores, the capacitor function units can be electrically connected to the processor cores respectively, thereby satisfactorily operating the respective processor cores. Accordingly, when a structure for mounting a semiconductor integrated circuit device having a plurality of processor cores is employed, the merit thereof can be drawn out to the maximum.

In addition, according to the structure described above, since the semiconductor integrated circuit device is supported on one ceramic capacitor, it is easy to match up the thermal expansion coefficient with that of the semiconductor integrated circuit device, thereby reducing affection of the thermal stress. Accordingly, it is possible to prevent cracks or connection failures of the semiconductor integrated circuit device resulting from the large thermal stress. Since the number of ceramic capacitors buried in the board core can be reduced, the process of assembling the ceramic capacitor can be simplified. Accordingly, it is possible to easily manufacture the circuit board and to accomplish the decrease in cost.

Here, the "semiconductor integrated circuit device" in aspect 1 means a semiconductor integrated circuit device which is used mainly as a micro processor of a computer and which has a plurality of processor cores. The semiconductor integrated circuit device is mounted on the semiconductor integrated circuit device mounting region, for example, in a flip chip manner. The number of processor cores may be 2, 3, or more. The "semiconductor integrated circuit device mounting region" means a region in which a group of terminal pads are arranged on the surface of the buildup layer.

According to another aspect (aspect 2) for achieving the above-mentioned objects, there is a provided a circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, and having a capacitor function unit and an extra-system capacitor function unit having a capacity smaller than that of the capacitor function unit, the ceramic capacitor being buried in the board core in a state where the main core surface and the main capacitor surface are directed in the same direction; and a buildup layer having a structure in which an interlayer insulating layer and a conductor layer are alternately stacked on the main core surface and the main capacitor surface and having a semiconductor integrated circuit device mounting region, which can be mounted with a semiconductor integrated circuit device having a processor core and an I/O circuit unit, set on the surface thereof, wherein the capacitor function unit can be electrically connected to the processor core and the extra-system capacitor function unit can be electrically connected to the I/O circuit unit.

Accordingly, in the circuit board according to aspect 2, the capacitor function unit of the ceramic capacitor can be electrically connected to the processor core and the extra-system capacitor function unit can be electrically connected to the I/O circuit unit. As a result, when a power supply system should be established in the I/O circuit unit independently of the power supply system of the processor core, it is possible to satisfactorily operate both units. Therefore, even when the inner structure of the semiconductor integrated circuit device is complicated, it is possible to draw out the ability of the semiconductor integrated circuit device to the maximum, thereby accomplishing the enhancement in performance.

In addition, according to the structure described above, since the semiconductor integrated circuit device is supported on one ceramic capacitor, it is easy to match up the thermal expansion coefficient with that of the semiconductor integrated circuit device, thereby reducing affection of the thermal stress. Accordingly, it is possible to prevent cracks or connection failures of the semiconductor integrated circuit device resulting from the large thermal stress. Since the number of ceramic capacitors buried in the board core can be reduced, the process of assembling the ceramic capacitor can be simplified. Accordingly, it is possible to easily manufacture the circuit board and to accomplish the decrease in cost.

Here, the "semiconductor integrated circuit device" in aspect 2 means a semiconductor integrated circuit device which is used mainly as a micro processor of a computer and which has, at least one processor core and one I/O circuit unit. The semiconductor integrated circuit device is mounted on the semiconductor integrated circuit device mounting region, for example, in a flip chip manner. The number of processor cores may be 1, 2, or more. The "semiconductor integrated circuit device mounting region" means a region in which a group of terminal pads are arranged on the surface of the buildup layer.

The number of I/O circuit units may be one or two. Here, the "I/O circuit unit" means an input circuit unit for processing a signal input to the processor core or an output circuit unit for processing a signal output from the processor core.

The board core of the circuit board, which constitutes a part of a core section of the circuit board, has a panel shape having a main core surface and a rear core surface opposite to the main core surface. The board core may have an accommodating hole portion for accommodating the ceramic capacitor. The accommodating hole portion may be a non-through hole which is opened only at the main core surface, or may be a through hole which is opened at both of the main core surface and the rear core surface.

The material of the board core is not particularly limited, but the board core is formed preferably from a polymer material as a major component. Specific examples of the polymer material forming the board core can include EP resin (epoxy resin), PI resin (polyimide resin), BT resin (bismaleimide triazine resin), and PPE resin (polyphenylene ether resin). Otherwise, a composition material of the resin and an organic fiber such as glass fiber (glass woven fabric or glass non-woven fabric) and polyamide fiber may be used.

The ceramic capacitor constituting the circuit board has a main capacitor surface and a rear capacitor surface, has a structure in which a first inner electrode layer and a second inner electrode layer are alternately stacked with a ceramic dielectric layer interposed therebetween, and has capacitor function units electrically independent of each other. The ceramic capacitor is buried in the board core in a state where the main core surface and the main capacitor surface are directed in the same direction. That is, the ceramic capacitor is used in a state in which the ceramic capacitor is buried in the board core. The ceramic capacitor is disposed in a region of the board core corresponding to the semiconductor integrated circuit mounting region. The ceramic capacitor is fixed by a filler of, for example, a polymer material in a state in which the ceramic capacitor is buried in the board core.

Suitable examples of the ceramic capacitor can include a via array type ceramic capacitor. That is, the ceramic capacitor has a plurality of power-supply via conductors electrically connecting the first inner electrode layers to each other and a plurality of ground via conductors electrically connecting the second inner electrode layers to each other. The power-supply via conductors and the ground via conductors are arranged preferably in an array as a whole. According to the above-mentioned structure, it is possible to easily accomplish the decrease in size of the whole capacitor and to easily accomplish the decrease in size of the whole circuit board. In addition, it is easy to accomplish a high electrostatic capacity in spite of its small size, thereby more stably supplying the electric power.

The number of capacitor function units may be 2, 3, or more, but may be equal to the number of processor cores when the number of processor cores is plural. According to this structure, it is possible to electrically connect the capacitor function units to the processor cores, respectively.

The ceramic capacitor constituting the circuit board according to aspect 2 has an extra-system capacitor function unit with a capacity smaller than that of the capacitor function unit. The size of the extra-system capacitor function unit as viewed in the plan view is smaller than the size of the capacitor function unit as viewed in the plan view. The number of extra-system capacitor function units may be 1 or more.

The capacitor function unit can be electrically connected to the processor core of the semiconductor integrated circuit device and the extra-system capacitor function unit can be electrically connected to the I/O circuit unit of the semiconductor integrated circuit device. That is, the capacitor function unit and the extra-system capacitor function unit can be electrically connected to the different circuit units of the semiconductor integrated circuit device, respectively. Specifically, the capacitor function unit is electrically connected to the power-supply conductor portion or the ground conductor portion included individually in the processor core. The extra-system capacitor function unit is electrically connected to the power-supply conductor portion or the ground conductor portion included individually in the I/O circuit unit.

Here, the processor core operates at a high frequency band (for example, a giga hertz band), but the I/O circuit unit operates at a frequency band (for example, mega hertz band) lower than the high frequency band. Accordingly, since the processor core requires a relatively high stable operation in comparison with the I/O circuit unit, it is necessary to connect the capacitor function unit with a relatively large capacity to the processor core. On the other hand, since the I/O circuit unit does not require such a high stable operation, the extra-system capacitor function unit with a relatively small capacity can be satisfactorily connected to the I/O circuit unit.

The capacitor function unit and the extra-system capacitor function unit may be disposed at any position. However, for example, when the capacitor function unit is disposed at the center of the ceramic capacitor, it is preferable that the extra-system capacitor function unit is disposed on the outer circumference of the ceramic capacitor. Since the processor core and the I/O circuit unit of the semiconductor integrated circuit device have the same arrangement pattern, they can be connected in short paths at the time of performing the electrical connection thereof.

The extra-system capacitor function unit may be a function unit only for input (for an input circuit), a function unit only for output (for an output circuit), or a function unit used for input and output. That is, the ceramic capacitor may include the first extra-system capacitor function unit and the second extra-system capacitor function unit. In this case, the second extra-system capacitor function unit can be electrically connected to the output circuit of the I/O circuit unit.

As the ceramic dielectric layer, a sintered body of high-temperature baked ceramics such as alumina, aluminum nitride, boron nitride, silicon carbide, and silicon nitride, or a sintered body of low-temperature baked ceramics such as glass ceramics in which an inorganic ceramic filler such as alumina is added to borosilicate glass or lead borosilicate glass is suitably used. In this case, it is preferable that a sintered body of dielectric ceramics such as barium titanate, lead titanate, and strontium titanate is used depending upon applications thereof. When the sintered body of dielectric ceramics is used, it is easy to embody a ceramic capacitor with a high electrostatic capacity.

The material of the first inner electrode layers and the second inner electrode layers is not particularly limited, but metal such as nickel, molybdenum, tungsten, and titanium which can be sintered at the same time as sintering ceramics can be suitably used. When the sintered body of low-temperature baked ceramics is selected, copper or silver can be used as the material of the first inner electrode layers and the second inner electrode layers.

A resistor made of a material having a resistance value higher than that of the material of the first inner electrode layers and the second inner electrode layers may be formed in the ceramic capacitor. According to this configuration, it is possible, for example, to set different potentials in a ceramic capacitor, thereby accomplishing the enhancement in performance of the circuit board. When the resistor is not formed in the ceramic capacitor, a resistor should be buried at a position of the board core other than the ceramic capacitor or a resistor should be disposed on the side of the buildup layer. Accordingly, it is difficult to form the resistor. The material of the resistor may be a conductive material having a resistance value higher than that of the first inner electrode layer and the second inner electrode layer and examples thereof can include a metal material or a ceramic material.

In the circuit board according to aspect 1, no structure may be disposed between a plurality of capacitor function units, or dummy conductors may be disposed therebetween. In this case, since the dummy conductors can be allowed to serve as all the shielding bodies, it is possible to reduce a noise due to the interference between the plurality of capacitor function units. Since a conductor made of metal or the like is more excellent in thermal conductivity than ceramic dielectrics, it is possible to enhance the heat sinking ability by disposing the dummy conductors. It is preferable that the dummy conductors are disposed to surround a plurality of capacitor function units. In this case, it is also possible to enhance the heat sinking ability.

The distance between the adjacent capacitor function units is not particularly limited, but is preferably a distance enough not to electrostatically interfere with each other. Specifically, the distance is preferably 50 μm or more. It is particularly preferable that a distance greater than the via pitch of a capacitor (a pitch between the ground and the power source) is secured.

Here, a plurality of capacitor function units may have the same capacity (electrostatic capacity) or may have different capacities. For example, it is assumed that the plurality of capacitor function units include a first capacitor function unit having a first capacity and a second capacitor function unit having a second capacity smaller than the first capacity. For the purpose of convenient explanation, the first capacitor function unit is referred to as a "large-capacity unit" and the second capacitor function unit is referred to as a "small-capacity unit." When the plurality of capacitor function units include the large-capacity unit and the small-capacity unit, the small-capacity unit is easily affected by the large-capacity unit, thereby easily generating a noise in the small-capacity unit due to the affection. However, as described above, by disposing the dummy conductors between the small-capacity unit and the large-capacity unit, it is possible to effectively reduce the noise. That is, when the capacitor function units include the large-capacity unit and the small-capacity unit, it is significant that the dummy conductors are disposed therebetween.

The dummy conductor basically means a dummy conductor not electrically connected to any of the capacitor function units. The shapes or materials of the dummy conductor are not particularly limited if only it can be disposed between the capacitor function units. The dummy conductor may be not connected to any of another conductor inside the ceramic capacitor and a conductor (for example, a conductor on the side of the board core or a conductor layer) of the buildup layer outside the ceramic capacitor. However, in order to surely obtain effects such as reduction in noise and enhancement in heat sinking ability, it is preferable that the dummy conductor is electrically connected to a ground conductor on the side of the board core or a ground conductor on the side of the buildup layer.

The material of the dummy conductor is not particularly limited, but metal such as nickel, molybdenum, tungsten, and titanium which can be sintered at the same time as sintering ceramics can be suitably used. When a sintered body of low-temperature baked ceramics is selected, copper or silver can be used as the material of the dummy conductor, A specific example of the dummy conductor can include a plurality of dummy via conductors penetrating through the main capacitor surface and the rear capacitor surface. That is, even when the individual dummy via conductors are not large enough, it is possible to sufficiently serve as a shielding member as a whole by disposing a plurality of dummy via conductors. The structure in which a plurality of dummy via conductors are disposed is suitable for a case that the ceramic capacitor is of a via array type.

Another specific example of the dummy conductor can include a dummy plain conductor disposed in at least one of the top of the main capacitor surface, the bottom of the rear capacitor surface, and the inside of the ceramic capacitor. Since the dummy plain conductor has a relatively large area, it can be easily allowed to serve as a shielding member. In this case, it is preferable that the dummy plain conductor is disposed inside the ceramic capacitor. That is, it is effective for accomplishing the satisfactory shielding that the dummy plain conductor (inner dummy plain conductor) is disposed between the first inner electrode layer and the second inner electrode layer in the ceramic capacitor. The inner dummy plain conductor may be disposed in one layer or in a plurality of layers.

In addition, the dummy conductor may include a plurality of dummy via conductors penetrating through the main capacitor surface and the rear capacitor surface, a main dummy plain conductor disposed on the top of the main capacitor surface and connected to the plurality of dummy via conductors, a rear dummy plain conductor disposed on the bottom of the rear capacitor surface and connected to the plurality of dummy via conductors, and an inner dummy plain conductor disposed in the inside of the ceramic capacitor and connected to the plurality of dummy via conductors. In this case, since a so-called three-dimensional shielding member is formed by means of a combination of a plurality of conductors having different shapes, the plurality of capacitor function units can be surely shielded, thereby effectively reducing the noise. It is also possible to satisfactorily enhance the heat sinking ability.

The buildup layer constituting the circuit board has a structure in which the interlayer insulating layer containing a polymer material as a major component and the conductor layer are alternately stacked. It is preferable that the buildup layer has a plurality of power-supply conductor portions electrically independent of each other and the plurality of capacitor function units are electrically connected to the plurality of processor cores through the plurality of power-supply conductor portions, respectively. A great difference exists in terminal pitch between the terminal group of the semiconductor integrated circuit device and the terminal group of the ceramic capacitor, but the processor cores and the capacitor function units can be individually and easily connected to each other through a plurality of power-supply conductor portions by forming a buildup layer. The buildup layer (first buildup layer) is formed only on the main core surface and the main capacitor surface, and a second buildup layer having a structure in which an interlayer insulating layer and a conductor layer are alternately stacked on the rear core surface and the rear capacitor surface may be further provided. In this case, since electrical circuits can be formed in the second buildup layer as well as the first buildup layer, it is possible to further accomplish the enhancement in performance of the circuit board.

The semiconductor integrated circuit device mounting region, on which a semiconductor integrated circuit device having a plurality of processor cores can be mounted, is set on the surface of the buildup layer (first buildup layer) formed on the main core surface and the main capacitor surface. The semiconductor integrated circuit device can be mounted on the semiconductor integrated circuit device mounting region. It is preferable that the area of the semiconductor integrated circuit device mounting region is set equal to or smaller than the area of the main capacitor surface of the ceramic capacitor and the semiconductor integrated circuit device mounting region is located in the main capacitor surface of the ceramic capacitor as viewed in the thickness direction of the ceramic capacitor. In this case, since the semiconductor integrated circuit device mounting region is located in a region right above the ceramic capacitor, the semiconductor integrated circuit device mounted on the semiconductor integrated circuit device mounting region is supported by the ceramic capacitor having a high rigidity and a small thermal expansion coefficient. Accordingly, since the buildup layer is hardly deformed in the semiconductor integrated circuit device mounting region, it is possible to more stably support the semiconductor integrated circuit device mounted on the semiconductor integrated circuit device mounting region. The area of the semiconductor integrated circuit device mounting region is set larger than the area of the main capacitor surface of the ceramic capacitor. However, in order to stably support the semiconductor integrated circuit device, it is preferable that the area of the main capacitor surface is set to 50% or more of the area of the semiconductor integrated circuit device mounting region.

According to another aspect (aspect 3) for achieving the above-mentioned objects, there is provided a circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, and having a plurality of capacitor function units electrically independent of each other, the ceramic capacitor being buried in the board core in a state where the main core surface and the main capacitor surface are directed in the same direction; and a buildup layer having a structure in which an interlayer insulating layer and a conductor layer are alternately stacked on the main core surface and the main capacitor surface and having a plurality of semiconductor integrated circuit device mounting regions set at positions different from each other on the surface thereof, wherein the plurality of capacitor function units can be electrically connected to the plurality of semiconductor integrated circuit device mounting regions, respectively.

Accordingly, in the circuit board according to aspect 3, even when a plurality of semiconductor integrated circuit devices cannot share a power supply system and different power supply systems should be provided to the semiconductor integrated circuit devices, the capacitor function units can be electrically connected to the plurality of semiconductor integrated circuit device mounting regions, respectively, thereby satisfactorily operating the respective semiconductor integrated circuit devices. Accordingly, when a structure for mounting a plurality of semiconductor integrated circuit devices is employed, the merit thereof can be drawn out to the maximum.

In addition, according to the structure described above, since the semiconductor integrated circuit devices are supported on one ceramic capacitor, it is easy to match up the thermal expansion coefficient with that of the semiconductor integrated circuit devices, thereby reducing affection of the thermal stress. Accordingly, it is possible to prevent cracks or connection failures of the semiconductor integrated circuit device resulting from the large thermal stress. Since only one ceramic capacitor is buried in the board core, the process of assembling the ceramic capacitor can be simplified. Accordingly, it is possible to easily manufacture the circuit board and to accomplish the decrease in cost.

According to another aspect (aspect 4) for achieving the above-mentioned objects, there is provided a ceramic capacitor having a main capacitor surface and a rear capacitor surface, having a structure in which a first inner electrode layer and a second inner electrode layer are alternately stacked with a ceramic dielectric layer, and having a plurality of capacitor function units electrically independent of each other.

Accordingly, in the ceramic capacitor according to aspect 4, for example, when the ceramic capacitor is electrically connected to a semiconductor integrated circuit device having a plurality of processor cores, the capacitor function units can be electrically connected to the processor cores, respectively, thereby satisfactorily operating the respective processor cores. Accordingly, when a structure for mounting a semiconductor integrated circuit device having a plurality of processor cores is employed, the merit thereof can be drawn out to the maximum. Even when the ceramic capacitor is electrically connected to a plurality of semiconductor integrated circuit devices having a processor core, the same advantages can be obtained.

In aspect 4, a dummy conductor may be disposed between the plurality of capacitor function units and the dummy conductor may be disposed to surround the plurality of capacitor function units. In this case, the dummy conductor may include a plurality of dummy via conductors penetrating through the main capacitor surface and the rear capacitor surface, or the dummy conductor may include a dummy plain conductor disposed in at least one of the top of the main capacitor surface, the bottom of the rear capacitor surface, and the inside of the ceramic capacitor. The reason is described above in aspect I and thus description thereof is omitted. More specifically, the dummy conductor may include a combination of a plurality of dummy via conductors penetrating through the main capacitor surface and the rear capacitor surface, a main dummy plain conductor disposed on the top of the main capacitor surface and connected to the plurality of dummy via conductors, and a rear dummy plain conductor disposed on the bottom of the rear capacitor surface and connected to the plurality of dummy via conductors. The reason is described above and thus description thereof is omitted.

According to another aspect (aspect 5) for achieving the above-mentioned objects, there is provided a circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, and having capacitor function units and an extra-system capacitor function unit having a capacity smaller than that of the capacitor function units, the ceramic capacitor being buried in the board core in a state where the main core surface and the main capacitor surface are directed in the same direction; and a buildup layer having a structure in which an interlayer insulating layer and a conductor layer are alternately stacked on the main core surface and the main capacitor surface and having a semiconductor integrated circuit device mounting region, on which a semiconductor integrated circuit device having a processor core can be mounted, set on the surface thereof, wherein the capacitor function unit can be electrically connected to the processor core and the extra-system capacitor function unit can be electrically connected to a circuit unit other than the processor core in the semiconductor integrated circuit device.

Accordingly, in the circuit board according to aspect 5, the capacitor function unit of the ceramic capacitor can be electrically connected to the processor core of the semiconductor integrated circuit device and the extra-system capacitor function unit can be electrically connected to the circuit unit other than the processor core in the semiconductor integrated circuit device. As a result, when a power supply system should be established in the circuit unit other than the processor core independently of the power supply system of the processor core, it is possible to satisfactorily operate both Therefore, even when the inner structure of the semiconductor integrated circuit device is complicated, it is possible to draw out the ability of the semiconductor integrated circuit device to the maximum, thereby easily accomplishing the enhancement in performance.

In addition, according to the structure described above, since the semiconductor integrated circuit device is supported on one ceramic capacitor, it is easy to match up the thermal expansion coefficient with that of the semiconductor integrated circuit device, thereby reducing affection of the thermal stress. Accordingly, it is possible to prevent cracks or connection failures of the semiconductor integrated circuit device resulting from the large thermal stress. Since the number of ceramic capacitors buried in the board core can be reduced, the process of assembling the ceramic capacitor can be simplified. Accordingly, it is possible to easily manufacture the circuit board and to accomplish the decrease in cost.

Here, the "semiconductor integrated circuit device" in aspect 5 means a semiconductor integrated circuit device which is used mainly as a micro processor of a computer and which has a plural kinds of circuit units including a processor core. Specific examples of the circuit unit other than the processor core in the semiconductor integrated circuit device can include the above-mentioned I/O circuit unit, a memory circuit unit, an A/D conversion circuit unit, a D/A conversion circuit unit, an operational amplifier unit, a PLL circuit unit, and a filter circuit unit. The semiconductor integrated circuit device of aspect 5 may include a sensor circuit unit for measuring a temperature, a humidity, a speed, an acceleration, a gas, a pressure, and the like, a light emitting circuit unit, a light receiving circuit unit, and a communication circuit unit. The semiconductor integrated circuit device of aspect 5 may be an MEMS including an actuator driving circuit unit for driving micro actuators such as a micro pump, a micro valve, and a micro motor formed on the device.

DESCRIPTION OF REFERENCE NUMERALS AND SIGNS

Figure 1:
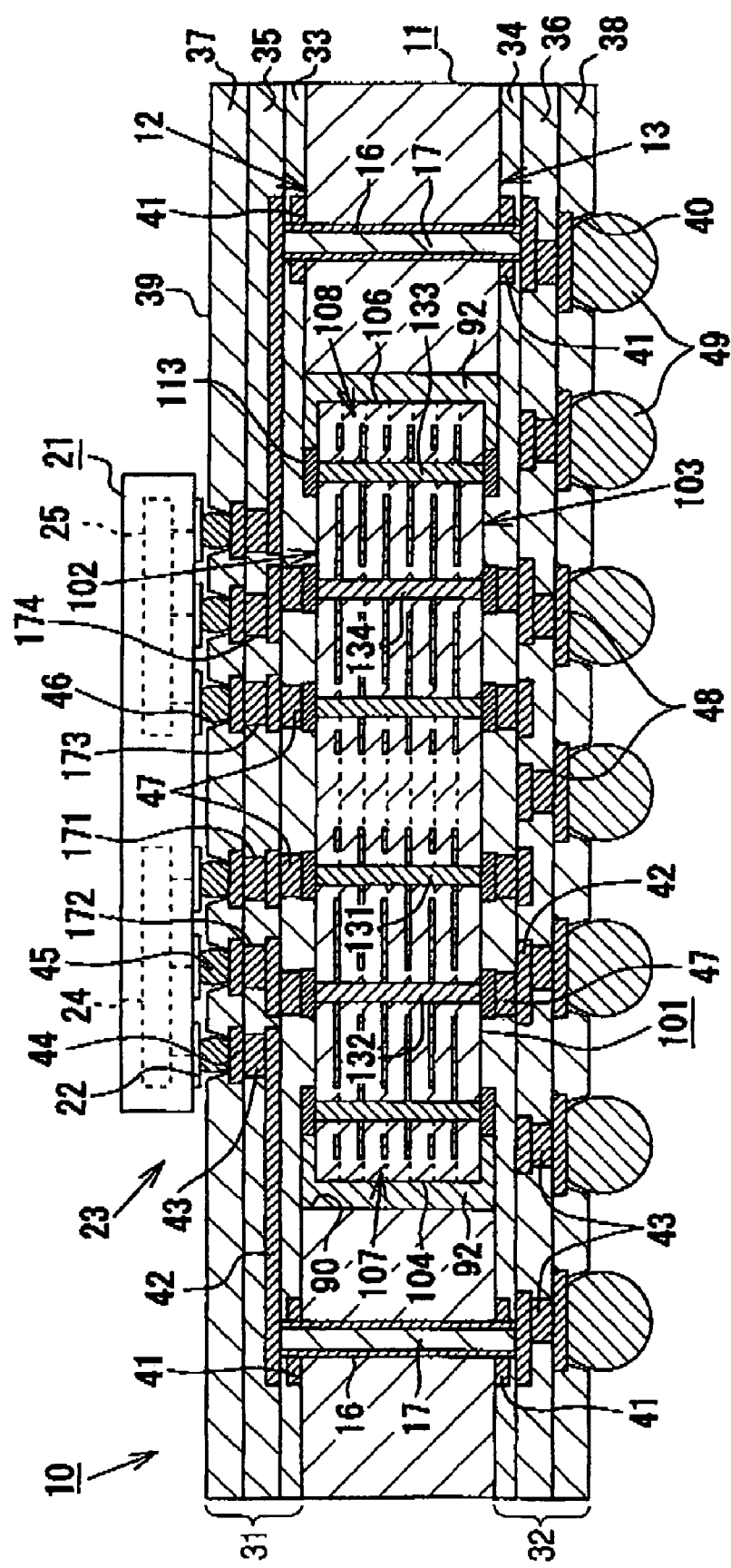
FIG. 1 is a schematic cross-sectional view illustrating a circuit board according to a first embodiment of the present invention.

10, 10', 10", 10''', 10A, 10B: Circuit board
11: Board core
12: Top surface as main core surface
13: Bottom surface as rear core surface
21: IC chip as semiconductor integrated circuit device
23: IC chip mounting region as semiconductor integrated circuit device mounting region
24, 25: Processor core
28, 29: I/O circuit unit
31: First buildup layer as buildup layer
32: Second buildup layer
33, 34, 35, 36: Resin insulating layer as interlayer insulating layer
39: Surface of buildup layer
42: Conductor layer
51, 52: IC chip mounting region as semiconductor integrated circuit device mounting region
101, 101', 101", 101''', 101'''', 101''''', 101'''''', 101A, 101C: Ceramic capacitor
102: Top surface of main capacitor surface
103: Bottom surface of rear capacitor surface
105: Ceramic dielectric layer
107: (First) capacitor function unit
108: (Second) capacitor function unit
141: First inner electrode layer
142: Second inner electrode layer
161: Resistor
171: First power supply conductor portion as power supply conductor portion
173: Second power supply conductor portion as power supply conductor portion
211: Dummy via conductor as dummy conductor
221: Front dummy plain conductor as dummy conductor
222: Rear dummy plain conductor as dummy conductor
223: Inner dummy plain conductor as dummy conductor

DETAILED DESCRIPTION OF THE INVENTION

First Embodiment

Hereinafter, a circuit board according to a first embodiment of the present invention will be described in detail with reference to the attached drawings.

As shown in FIG. 1, a circuit board 10 according to the first embodiment is a circuit board for mounting an JC chip and includes a substantially rectangular panel-shaped board core 11 made of glass epoxy, a first buildup layer 31 (buildup layer) formed on the top surface 12 (main core surface) of the board core 11, and a second buildup layer 32 formed on the bottom surface 13 (rear core surface) of the board core 11. Through-hole conductors 16 are formed at a plurality of positions in the board core 11. The through-hole conductors 16 electrically connect the top surface 12 of the board core 11 to the bottom surface 13. The insides of the through-hole conductors 16 are filled with a filler 17 such as epoxy resin. Patterned conductor layers 41 made of copper are formed on the top surface 12 and the bottom surface 13 of the board core 11. The conductor layers 41 are electrically connected to the through-hole conductors 16.

The first buildup layer 31 formed on the top surface 12 of the board core 11 has a structure in which two resin insulating layers 33 and 35 (so-called interlayer insulating layers) made of epoxy resin and a conductor layer 42 made of copper are alternately stacked. In the embodiment, the thermal expansion coefficient of the first buildup layer 31 is in the range of 30 to 40 ppm/° C. and suitably about 35 ppm/° C. The thermal expansion coefficient of the first buildup layer 31 means an average value of measured values between 30° C. and the glass transition temperature Tg. Some of the conductor layers 42 on the surface of the first resin insulating layer 33 are electrically connected to the top ends of the through-hole conductors 16. Terminal pads 44 are formed in an array shape at a plurality of positions on the surface of the second resin insulating layer 35. The almost whole surface of the resin insulating layer 35 is covered with a solder resist 37. Openings 46 for exposing the terminal pads 44 are formed at predetermined positions in the solder resist 37. A plurality of solder bumps 45 are formed on the surface of the terminal pads 44. The solder bumps 45 are electrically connected to surface connection terminals 22 of an IC chip 21 (semiconductor integrated circuit device). The IC chip 21 has a rectangular panel shape and includes two process cores 24 and 25. In the embodiment, the IC chip 21 is made of silicon having a thermal expansion coefficient of about 3.5 ppm/° C. The terminal pads 44 and the solder bumps 45 are disposed in a region of the first buildup layer 31 right above a ceramic capacitor 101 and the region serves as an IC chip mounting region 23 (semiconductor integrated circuit device mounting region). The IC chip mounting region 23 is set on the surface 39 of the first buildup layer 31. Via conductors 43 and 47 are disposed in the resin insulating layers 33 and 35, respectively. Most of the via conductors 43 and 47 are disposed coaxially and the conductor layers 41 and 42 and the terminal pads 44 are electrically connected to each other with the via conductors interposed therebetween.

As shown in FIG. 1, the second buildup layer 32 formed on the bottom 13 of the board core 11 has almost the same structure as the first buildup layer 31. That is, the second buildup layer 32 has a thermal expansion coefficient of 30 to 40 ppm/° C. and has a structure in which two resin insulating layers 34 and 36 (so-called interlayer insulating layers) made of epoxy resin and a conductor layer 42 are alternately stacked. A part of the conductor layer 42 under the first resin insulating layer 34 is electrically connected to the lower end of the through-hole conductor 16. BGA pads 48 electrically connected to the conductor layer 42 with the via conductors 43 interposed therebetween are formed in a lattice shape at a plurality of positions under the second resin insulating layer 36. The bottom of the second resin insulating layer 36 is covered with a solder resist 38 as a whole. Openings 40 for exposing the BGA pads 48 are formed at predetermined positions in the solder resist 38. A plurality of solder bumps 49 for electrical connection to a mother board not shown are formed on the surfaces of the BGA pads 48. The circuit board 10 shown in FIG. 1 is mounted on the mother board not shown with the solder bumps 49 therebetween.

Figure 2:
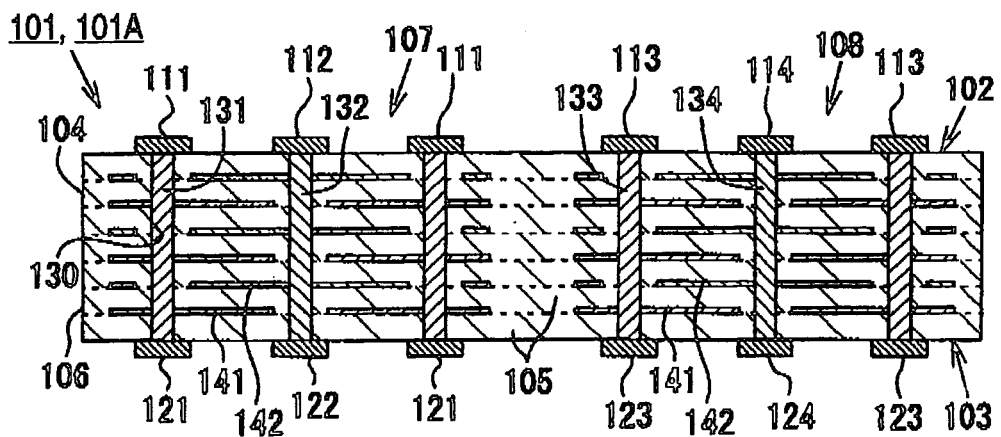
FIG. 2 is a schematic cross-sectional view illustrating a ceramic capacitor according to the first embodiment of the invention.
Figure 3:
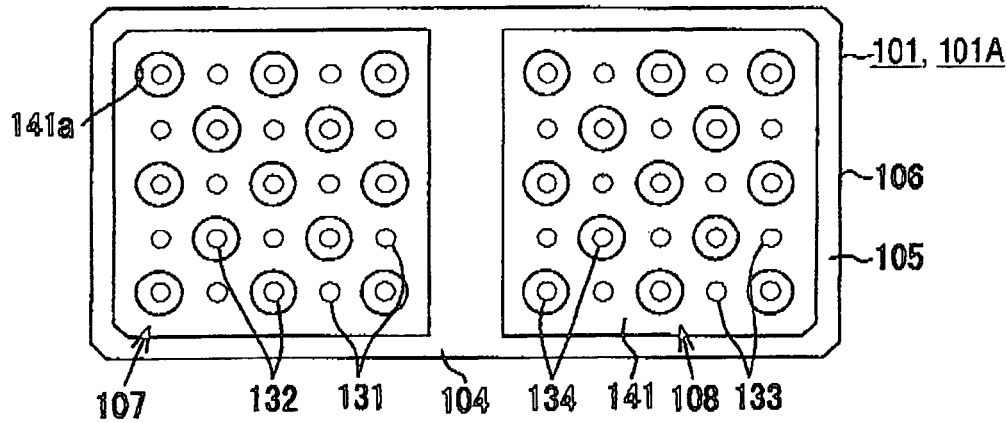
FIG. 3 is a schematic explanatory diagram illustrating connections in the inner layers of the ceramic capacitor according to the first embodiment of the invention.
Figure 4:
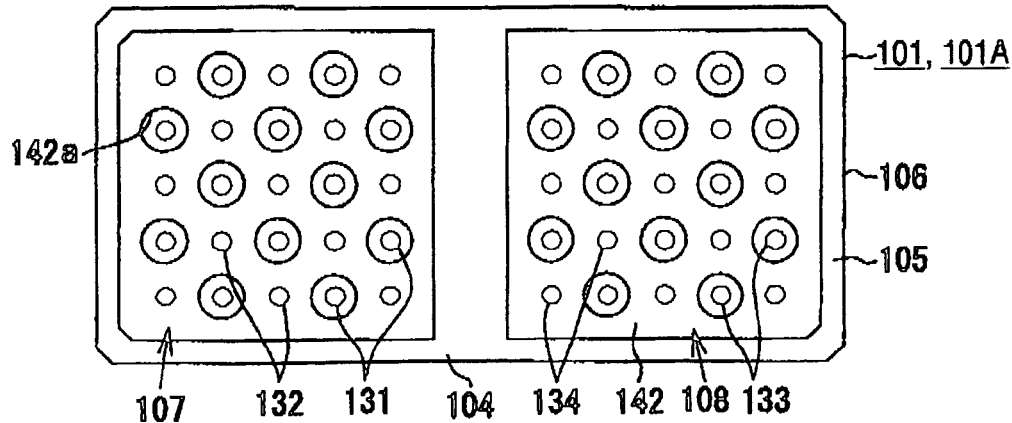
FIG. 4 is a schematic explanatory diagram illustrating connections in the inner layers of the ceramic capacitor according to the first embodiment of the invention.

The board core 11 has a thermal expansion coefficient of 10 to 15 ppm/° C. in the plane direction (XY direction). The thermal expansion coefficient of the board core 11 means the average value of measured values between 0° C. to the glass transition temperature Tg. The board core 11 has an accommodating hole portion 90, which has a rectangular shape as viewed in a plan view, opened at the center of the top surface 12 and the center of the bottom surface 13. That is, the accommodating hole portion 90 is a through hole. A ceramic capacitor 101 shown in FIGS. 2 to 4 are buried and accommodated in the accommodating hole portion 90. The ceramic capacitor 101 is accommodated in a state in which a top surface 102 (main capacitor surface) is directed to the same direction as the top surface 12 of the board core 11. In the embodiment, the ceramic capacitor 101 has a rectangular panel shape with longitudinal length 6.0 mm×lateral length 12.0 mm×thickness 0.8 mm. The thickness of the ceramic capacitor 101 is preferably in the range of 0.2 mm to 1.0 mm. When the thickness is less than 0.2 mm, the stress at the time of bonding the IC chip 21 to the IC chip mounting region 23 cannot be reduced by the ceramic capacitor 101 and thus the ceramic capacitor is not satisfactory as a support. On the other hand, when the thickness is larger than 1.0 mm, the thickness of the circuit board is too great. The thickness of the ceramic capacitor 101 is more preferably in the range of 0.4 mm to 0.8 mm. The ceramic capacitor 101 is disposed right below the IC chip mounting region 23 in the board core 11. The area of the IC chip mounting region 23 (the area of the surface on which the surface connection terminals 22 in the IC chip 21) is set smaller than the area of the top surface 102 of the ceramic capacitor 101. As viewed in the thickness direction of the ceramic capacitor 101, the IC chip mounting region 23 is located in the top surface 102 of the ceramic capacitor 101.

As shown in FIG. 1, the gap between the inner surface of the accommodating hole portion 90 and the side surface 106 of the ceramic capacitor 101 is filled with a filler 92 made of a polymer material (thermosetting resin such as epoxy in the embodiment). The filler 92 has a function of fixing the ceramic capacitor 101 to the board core 11 and absorbing the deformation of the ceramic capacitor 101 and the board core 11 in the plane direction or the thickness direction by means of its own elastic deformation. The ceramic capacitor 101 has an almost square shape as viewed in the plan view, and has tapers of C0.6 at the four corners. Accordingly, since the stress concentrated on the corners of the ceramic capacitor 101 at the time of deformation of the filler 92 with change in temperature can be alleviated, it is possible to prevent cracks of the filler 92.

As shown in FIGS. 1 to 4, the ceramic capacitor 101 according to the embodiment is a so-called via array type ceramic capacitor. It is preferable that a sintered ceramic body 104 constituting the ceramic capacitor 101 has a thermal expansion coefficient which is a value between the thermal expansion coefficient of the IC chip 21 and the thermal expansion coefficient of the buildup layers 31 and 32 and which is close to the thermal expansion coefficient of the IC chip 21. In the embodiment, the thermal expansion coefficient of the sintered ceramic body 104 is in the range of 8 to 12 ppm/° C. and specifically about 9.5 ppm/° C. The thermal expansion coefficient of the sintered ceramic body 104 means the average value of measured values between 30° C. to 250° C. The sintered ceramic body 104 has a plate shape having the top surface 102 and the bottom surface 103 (rear capacitor surface). The resin insulating layer 33 constituting the first buildup layer 31 is formed on the top surface 102 of the sintered ceramic body 104 and the resin insulating layer 34 constituting the second buildup layer 32 is formed on the bottom surface 103 of the sintered ceramic body 104. The sintered ceramic body 104 has a structure in which a first inner electrode layer 141 and a second inner electrode layer 142 are alternately stacked with a ceramic dielectric layer 105 therebetween. The ceramic dielectric layer 105 is formed of a sintered body of barium titanate which is a kind of high dielectric ceramics and serves as a dielectric (insulating layer) between the first inner electrode layer 141 and the second inner electrode layer 142. The first inner electrode layer 141 and the second inner electrode layer 142 all contain nickel as a major component and are disposed every other layer in the sintered ceramic body 104.

As shown in FIGS. 2 to 4, the ceramic capacitor 101 has two capacitor function units 107 and 108. The ceramic dielectric layer 105 is used in both capacitor function units 107 and 108. As viewed in the thickness direction of the ceramic capacitor 101, the processor core 24 of the IC chip 21 is located in the surface of the capacitor function unit 107 and the processor core 25 of the IC chip 21 is located in the surface of the capacitor function unit 108.

A plurality of via holes 130 are formed in the capacitor function unit 107. The via holes 130 penetrate through the capacitor function unit 107 in the thickness direction thereof and are disposed in the lattice shape (array shape) over the whole surface of the capacitor function unit 107. A plurality of via conductors 131 and 132, which contain nickel as. a major component, communicating with the top surface 102 and the bottom surface 103 of the sintered ceramic body 104 in the capacitor function unit 107 are formed in the via holes 130. First power-supply via conductors 131 penetrate through the first inner electrode layers 141 and electrically connect the first inner electrode layers to each other. First ground via conductors 132 penetrate through the second inner electrode layers 142 and electrically connect the second inner electrode layers to each other. Here, as shown in FIG. 3, clearance holes 141a are formed in regions of the first inner electrode layers 141 through which the first ground via conductors 132 penetrate, thereby electrically isolating the first inner electrode layers 141 and the first ground via conductors 132 from each other. Similarly, as shown in FIG. 4, clearance holes 142a are formed in regions of the second inner electrode layers 142 through which the first power-supply via conductors 131 penetrate, thereby electrically isolating the second inner electrode layers 142 and the first power-supply via conductors 131 from cach other.

The first power-supply via conductors 131 and the first ground via conductors 132 are disposed in an array shape as a whole. For the purpose of convenient explanation, the via conductors 131 and 132 are shown in 3 rows×3 columns (or 5 rows×5 columns), but more rows and columns are disposed in practice.

As shown in FIGS. 2 to 4, a plurality of first power-supply electrode terminals 111 and a plurality of first ground electrode terminals 112 are protruded from the top surface 102 of the sintered ceramic body 104 in the capacitor function unit 107. In addition, a plurality of first power-supply electrode terminals 121 and a plurality of first ground electrode terminals 122 are protruded from the bottom surface 103 of the sintered ceramic body 104 in the capacitor function unit 107. The electrode terminals 111 and 112 on the top surface 102 are electrically connected to the via conductors 47. On the other hand, the electrode terminals 121 and 122 on the bottom surface 103 are electrically connected to electrodes (contactors) of the mother board not shown through the via conductors 47, the conductor layer 42, the via conductors 43, the BGA pads 48, and the solder bumps 49. The substantial center portions of the bottom surfaces of the electrode terminals 111 and 112 are connected directly to the ends of the via conductors 131 and 132 close to the top surface 102 and the substantial center portions of the bottom surfaces of the electrode terminals 121 and 122 are connected directly to the ends of the via conductors 131 and 132 close to the bottom surface 103. Accordingly, the power-supply electrode terminals 111 and 121 are electrically connected to the first power-supply via conductors 131 and the first inner electrode layers 141 and the ground electrode terminals 112 and 122 are electrically connected to the first ground via conductors 132 and the second inner electrode layers 142.

Similarly, A plurality of via holes 130 are formed in the capacitor function unit 108 shown in FIGS. 2 to 4. A plurality of via conductors 133 and 134, which contain nickel as a major component, communicating with the top surface 102 and the bottom surface 103 of the sintered ceramic body 104 in the capacitor function unit 108 are formed in the via holes 130. Second power-supply via conductors 133 penetrate through the first inner electrode layers 141 and electrically connect the first inner electrode layers to each other. Second ground via conductors 134 penetrate through the second inner electrode layers 142 and electrically connect the second inner electrode layers to each other. The second power-supply via conductors 133 and the second ground via conductors 134 are disposed in an array shape as a whole. For the purpose of convenient explanation, the via conductors 133 and 134 are shown in 3 rows×3 columns (or 5 rows×5 columns), but more rows and columns are disposed in practice.

A plurality of second power-supply electrode terminals 113 and a plurality of second ground electrode terminals 114 are protruded from the top surface 102 of the sintered ceramic body 104 in the capacitor function unit 108. In addition, a plurality of second power-supply electrode terminals 123 and a plurality of second ground electrode terminals 124 are protruded from the bottom surface 103 of the sintered ceramic body 104 in the capacitor function unit 108. The electrode terminals 113 and 114 on the top surface 102 are electrically connected to the via conductors 47. On the other hand, the electrode terminals 123 and 124 on the bottom surface 103 are electrically connected to electrodes (contactors) of the mother board not shown through the via conductors 47, the conductor layer 42, the via conductors 43, the BGA pads 48, and the solder bumps 49. The substantial center portions of the bottom surfaces of the electrode terminals 113 and 114 are connected directly to the ends of the via conductors 133 and 134 close to the top surface 102 and the substantial center portions of the bottom surfaces of the electrode terminals 123 and 124 are connected directly to the ends of the via conductors 133 and 134 close to the bottom surface 103. Accordingly, the power-supply electrode terminals 113 and 123 are electrically connected to the second power-supply via conductors 133 and the first inner electrode layers 141 and the ground electrode terminals 114 and 124 are electrically connected to the second ground via conductors 134 and the second inner electrode layers 142.

As shown in FIG. 2, the electrode terminals 111, 112, 113, and 114 are formed mainly from nickel and the surfaces thereof are coated with a copper plating layer (not shown in FIG. 2) as a whole. Similarly, the electrode terminals 121, 122, 123, and 124 are formed mainly from nickel and the surfaces thereof are coated with a copper plating layer (not shown in FIG. 2). In the embodiment, the diameters of the electrode terminals 111 to 114 and 121 to 124 are set to about 500 μm and the minimum pitch is set to about 580 μm.

When an electrical power is applied through the electrode terminals 121 and 122 (or electrode terminals 123 and 124) from the mother board and a voltage is applied across the first inner electrode layers 141 and the second inner electrode layers 142, for example, plus electric charges are accumulated on the first inner electrode layers 141 and for example, minus electric charges are accumulated on the second inner electrode layers 142. As a result, the ceramic capacitor 101 serves as a capacitor. In the capacitor function unit 107, the first power-supply via conductors 131 and the first ground via conductors 132 are alternately disposed adjacent to each other and the directions of current flowing through the first power-supply via conductors 131 and the first ground via conductors 132 are set opposite to each other. Similarly, in the capacitor function unit 108, the second power-supply via conductors 133 and the second ground via conductors 134 are alternately disposed adjacent to each other and the directions of current flowing through the second power-supply via conductors 133 and the second ground via conductors 134 are set opposite to each other. Accordingly, inductance components are reduced.

As shown in FIG. 1, a part of each first power-supply via conductor 131 is electrically connected to the processor core 24 of the IC chip 21 through the corresponding first power-supply electrode terminal 111, the corresponding first power-supply conductor portion 171 (power-supply conductor portion) of the first buildup layer 31, and the corresponding surface connection terminal 22 of the IC chip 21. A part of each first ground via conductor 132 is electrically connected to the processor core 24 through the corresponding first ground electrode terminal 112, the corresponding first ground conductor portion 172 of the first buildup layer 31, and the corresponding surface connection terminal 22. Accordingly, it is possible to supply an electrical power to the processor core 24 from the capacitor function unit 107. The first power-supply conductor portions 171 and the first ground conductor portions 172 are conductor portions including the via conductors 47, the conductor layers 42, the via conductors 43, the terminal pads 44, and the solder bumps 45.

Similarly, a part of each second power-supply via conductor 133 is electrically connected to the processor core 25 of the IC chip 21 through the corresponding second power-supply electrode terminal 113, the corresponding second power-supply conductor portion 173 (power-supply conductor portion) of the first buildup layer 31, and the corresponding surface connection terminal 22 of the IC chip 21. A part of each second ground via conductor 134 is electrically connected to the processor core 25 through the corresponding second ground electrode terminal 114, the corresponding second ground conductor portion 174 of the first buildup layer 31, and the corresponding surface connection terminal 22. Accordingly, it is possible to supply an electrical power to the processor Core 25 from the capacitor function unit. 108. The second power-supply conductor portions 173 and the second ground conductor portions 174 are conductor portions including the via conductors 47, the conductor layers 42, the via conductors 43, the terminal pads 44, and the solder bumps 45. The second power-supply conductor portions 173 are electrically independent of the first power-supply conductor portions 171 and the second ground conductor portions 174 are electrically independent of the first ground conductor portions 172.

Accordingly, in the circuit board 10 according to the embodiment, an independent power supply system is provided to each of the processor cores 24 and 25. As a result, the capacitor function units 107 and 108 are electrically independent of each other. Accordingly, an electrical path in the ceramic capacitor 101 is divided into a first electrical path connecting the capacitor function unit 107 to the processor core 24 and a second electrical path connecting the capacitor function unit 108 to the processor core 25. The insulating portions (ceramic dielectric layers 105) of the capacitor function units 107 and 108 are physically integrated. However, the conductor portions of the capacitor function units 107 and 108 are physically independent of each other since the disposing regions thereof are isolated from each other.

Next, a method of manufacturing the circuit board 10 according to the embodiment will be described.

In a preparation process, the board core 11 and the ceramic capacitor 101 are previously manufactured and prepared by the use of known methods.

The board core 11 is manufactured as follows. First, a copper coated plate in which copper foils with a thickness of 35 μm are bonded to both surfaces of a base member with longitudinal length 400 mm×lateral length of 400 mm×thickness 0.8 mm is prepared. The thickness of the base member is preferably in the range of 0.2 mm to 1.0 mm. Next, by punching the copper coated plate using a router, a through hole which becomes the accommodating hole portion 90 is previously formed at a predetermined position (see FIG. 5). The through hole which becomes the accommodating hole portion 90 is a rectangular sectional shape with a longitudinal length 14.0 mm×a lateral length 30.0 mm and R of a radius 1.5 mm at four corners thereof. The conductor layer 41 is patterned using, for example, a subtractive method by etching the copper foils on both surfaces of the copper coated plate. Specifically, after an electroless copper plating process, an electrolytic copper plating process is performed using the electroless copper plating layer as a common electrode. A dry film is laminated thereon and the dry film is formed in a predetermined pattern by exposing and developing the dry film. In this state, an unnecessary electrolytic copper plating layer, an unnecessary electroless copper plating layer, and an unnecessary copper foil are removed by etching. Thereafter, by peeling off the dry film, the board core 11 is obtained.

The ceramic capacitor 101 is manufactured as follows. That is, a ceramic green sheet is formed, and nickel paste for inner electrodes is printed and dried on the green sheet by using a screen printing method. In this way, a first inner electrode portion which becomes the first inner electrode layer 141 and a second inner electrode portion which becomes the second inner electrode layer 142 are formed. Next, by alternately stacking the green sheet in which the first inner electrode portion is formed and the green sheet in which the second inner electrode portion is formed and applying a pressing force thereto in the sheet stacking direction, the green sheets are integrated to form a green sheet laminate.

A plurality of via holes 130 are formed in the green sheet laminate by the use of a laser processing machine and the nickel paste for via conductors are filled in the via holes 130 by the use of a paste pressing and filling machine not shown. Next, paste is printed on the top surface of the green sheet laminate and the first power-supply electrode terminals 111, the first ground electrode terminals 112, the second power-supply electrode terminals 113, and the second ground electrode terminals 114 are formed so as to cover the top ends of the conductor portions from the top surface of the green sheet laminate. In addition, paste is printed on the bottom surface of the green sheet laminate and the first power-supply electrode terminals 121, the first ground electrode terminals 122, the second power-supply electrode terminals 123, and the second ground electrode terminals 124 are formed so as to cover the bottom ends of the conductor portions from the bottom surface of the green sheet laminate.

Thereafter, the green sheet laminate is dried to solidify the surface terminal portions to some extent. Next, the green sheet laminate is defatted and baked at a predetermined temperature for a predetermined time. As a result, barium titanate and nickel in the paste are simultaneously sintered to form the sintered ceramic body 104.

An electroless copper plating process (with a thickness of about 10 μm) is performed the electrode terminals 111 to 114 and 121 to 124 of the obtained sintered ceramic body 104. As a result, a copper coating layer is formed on the electrode terminals 111 to 114 and 121 to 124, thereby completing the ceramic capacitor 101.

In the subsequent fixing process, the ceramic capacitor 101 is accommodated in the accommodating hole portion 90 by the use of a mounting machine (made by Yamaha Motor Co., Ltd.) (see FIG. 6). At this time, the side of the accommodating hole portion 90 close to the bottom surface 13 is sealed with an adhesive tape 152 which can be peeled off. The adhesive tape 152 is supported by a support 151. The ceramic capacitor 101 is temporarily fixed to the adhesive surface 153 of the adhesive tape 152.

In this state, the gap between the inner surface of the accommodating hole portion 90 and the side surface 106 of the ceramic capacitor 101 is filled with the filler 92 made of thermosetting resin (an under-filling material made by Namics Corporation) by the use of a dispenser machine (made by Asymtek company). Thereafter, by heating the resultant structure, the filler 92 is hardened and the ceramic capacitor 101 is fixed into the accommodating hole portion 90. At this time, the adhesive tape 152 is peeled off.

Thereafter, a process of forming a buildup layer is performed. In the process of forming a buildup layer, the first buildup layer 31 is formed on the top surface 12 and the top surface 102 and the second buildup layer 32 is formed on the bottom surface 13 and the bottom surface 103, by the use of a known method. Specifically, by bonding a photosensitive epoxy resin layer to the top surface 12 and the top surface 102, bonding a photosensitive epoxy resin to the bottom surface 13 and the bottom surface 103, and performing an exposing and developing process thereto, the first resin insulating layers 33 and 34 having blind holes at positions at which the via conductors 47 should be formed are formed. By performing a laser punching process using an YAG laser or a carbon dioxide laser, penetrating holes penetrating through the board core 11 and the resin insulating layers 33 and 34 are formed in advance at predetermined positions. The through-hole conductors 16 are formed by performing the electroless copper plating process and the electrolyte copper plating process in a known method, and then the through-hole conductors 16 are filled with a filler 17. Next, by performing the electrolyte copper plating process in a known method (for example, a semi additive method), the via conductors 47 are formed in the blind holes and the second conductor layers 42 are formed on the first resin insulating layers 33 and 34.

Then, by bonding a photosensitive epoxy resin layer to the first resin insulating layers 33 and 34 and performing an exposing and developing process, the second resin insulating layers 35 and 36 having blind holes at positions at which the via conductors 43 should be formed are formed. By performing the electrolyte copper plating process in the known method, the via conductors 43 are formed in the blind holes, the terminal pads 44 are formed on the second resin insulating layer 35, and the BGA pads 48 are formed on the second resin insulating layer 36.

A photosensitive epoxy resin is applied onto the second resin insulating layers 35 and 36 and then is dried, thereby forming solder resists 37 and 38. An exposing and developing process is performed in a state in which a predetermined mask is disposed, thereby patterning openings 40 and 46 in the solder resists 37 and 38. The solder bumps 45 are formed on the terminal pads 44 and the solder bumps 49 are formed on the BGA pads 48. As a result, the circuit board 10 including the board core 11 and the buildup layers 31 and 32 is completed.

Therefore, according to the embodiment, the following advantages can be obtained.

(1) In the circuit board 10 according to the embodiment, even when two processor cores 24 and 25 cannot share a power supply system and different power supply systems should be provided to the respective processor cores 24 and 25, two capacitor function units 107 and 108 can be electrically connected to two processor cores 24 and 25, respectively, thereby satisfactorily operating the respective processor cores 24 and 25. Accordingly, when a multi-core micro processor structure is used as in the embodiment, the merit thereof can be drawn out to the maximum.

(2) In the embodiment, since the IC chip mounting region 23 of the IC chip 21 is located in the area right above the ceramic capacitor 101, the IC chip 21 mounted on the IC chip mounting region 23 is supported by the ceramic capacitor 101 having a high rigidity and a small thermal expansion coefficient. Accordingly, since the first buildup layer 31 is not deformed well in the IC chip mounting region 23, it is possible to more stably support the IC chip 21 mounted on the IC chip mounting region 23. As a result, it is possible to prevent cracks or connection failures of the IC chip 21 due to a large thermal stress. Therefore, a large-sized IC chip with a length of 10 mm or more being subjected to a great affection of the thermal stress due to the great stress (distortion) resulting from the difference in thermal expansion and being subjected to a thermal impact in use due to the great amount of heat radiation or a brittle low-k (low-dielectric-constant) IC chip can be used as the IC chip 21.

Since the ceramic capacitor 101 according to the embodiment has two capacitor function units 107 and 108, it is possible to smoothly supply an electric power to the processor cores 24 and 25 by removing noises from the capacitor function units 107 and 108. In addition, the processor cores 24 and 25 are disposed right above the capacitor function units 107 and 108, respectively. Accordingly, the electrical paths (capacitor connection lines) electrically connecting the processor cores 24 and 25 to the capacitor function units 107 and 108 are shortest. As a result, it is possible to smoothly supply the electric power to the processor cores 24 and 25. Moreover, since the noises invaded between the IC chip 21 and the ceramic capacitor 101 can be suppressed very much, it is possible to obtain high reliability without causing failure such as an erroneous operation.

(3) On the other hand, a technique of burying a plurality of chip capacitors in a board core is disclosed in Paragraph [0063] of JP-A-2002-43754. However, since the same number of accommodating hole portions 90 as the chip capacitors should be formed in the board core 11 in order to bury the plurality of chip capacitors, it is difficult to manufacture the board core 11 and the circuit board 10. Even when a plurality of chip capacitors is provided, it is difficult to accomplish the enhancement in performance based on the stable power supply. In addition, since the area of the top surface of each chip capacitor is much smaller than that of the IC chip mounting region 23, the chip capacitors cannot be allowed to serve as a support of the IC chip 21. As a result, since the thermal expansion coefficients of the IC chip 21 and the circuit board 10 are not matched with each other, a great thermal stress acts on the IC chip 21, thereby easily causing the cracks or the connection failures in the IC chip 21.

In the embodiment, since one ceramic capacitor 101 is used instead of a plurality of chip capacitors, it is enough to form only one accommodating hole portion 90 in the board core 11. Accordingly, since the process of assembling the ceramic capacitor 101 is simplified, it is possible to easily manufacture the circuit board 10, thereby accomplishing decrease in cost. In addition, since the ceramic capacitor 101 is not a simple chip capacitor but is of a via array type with a large electrostatic capacity, it is easy to accomplish the enhancement in performance. In the embodiment, the area of the IC chip mounting region 23 is set smaller than the area of the top surface 102 of the ceramic capacitor 101. In other words, the ceramic capacitor 101 has an area larger than the area of the IC chip mounting region 23. In addition, the IC chip mounting region 23 is located within the top surface 102 of the ceramic capacitor 101 as viewed in the thickness direction. Accordingly, one ceramic capacitor 101 can be allowed to serve as a support of the IC chip 21. As a result, it is possible to prevent the cracks or the connection failures of the 11 chip 21 resulting from the great thermal stress.

(4) For example, it is considered that a chip capacitor is used instead of the ceramic capacitor 101 and the chip capacitor is disposed on the rear surface (the surface of the second buildup layer 32) of the circuit board 10 opposite to the IC chip 21. In this case, since inductance of the chip capacitor is 7.2 pH and inductance of the electrical path connecting the chip capacitor to the IC chip 21 is 2.8 pH, the total inductance is 10.0 pH, which is relatively large.

On the other hand, in the embodiment, the ceramic capacitor 101 having inductance (1.2 pH) lower than that of the chip capacitor is used. In addition, since the ceramic capacitor 101 is buried in the board core 11, the electrical path connecting the ceramic capacitor 101 to the IC chip 21 is shorter than the electrical path connecting the chip capacitor to the IC chip 21. Accordingly, the inductance of the electrical path is lowered to 0.6 pH. As a result, since the total inductance is 1.8 pH, it is possible to reduce the inductance component in comparison with the chip capacitor. Accordingly, it is possible to smoothly supply an electric power, thereby preventing generation of noises.

(5) In the capacitor function unit 107 of the embodiment, a plurality of first power-supply via conductors 131 and a, plurality of first ground via conductors 132 are disposed in an array as a whole. Similarly, in the capacitor function unit 108 of the embodiment, a plurality of second power-supply via conductors 133 and a plurality of second ground via conductors 134 are disposed in an array as a whole. That is, the ceramic capacitor 101 including the capacitor function units 107 and 108 is of a via array type. Accordingly, it is easy to accomplish decrease in size of the ceramic capacitor 101 and to accomplish decrease in size of the entire circuit board 10. In addition, it is possible to easily accomplish a high electrostatic capacity in spite of its small size, thereby more stably supplying the electric power.

Second Embodiment

Hereinafter, a circuit board according to a second embodiment of the invention will be described in detail with reference to the drawings.

Figure 8:
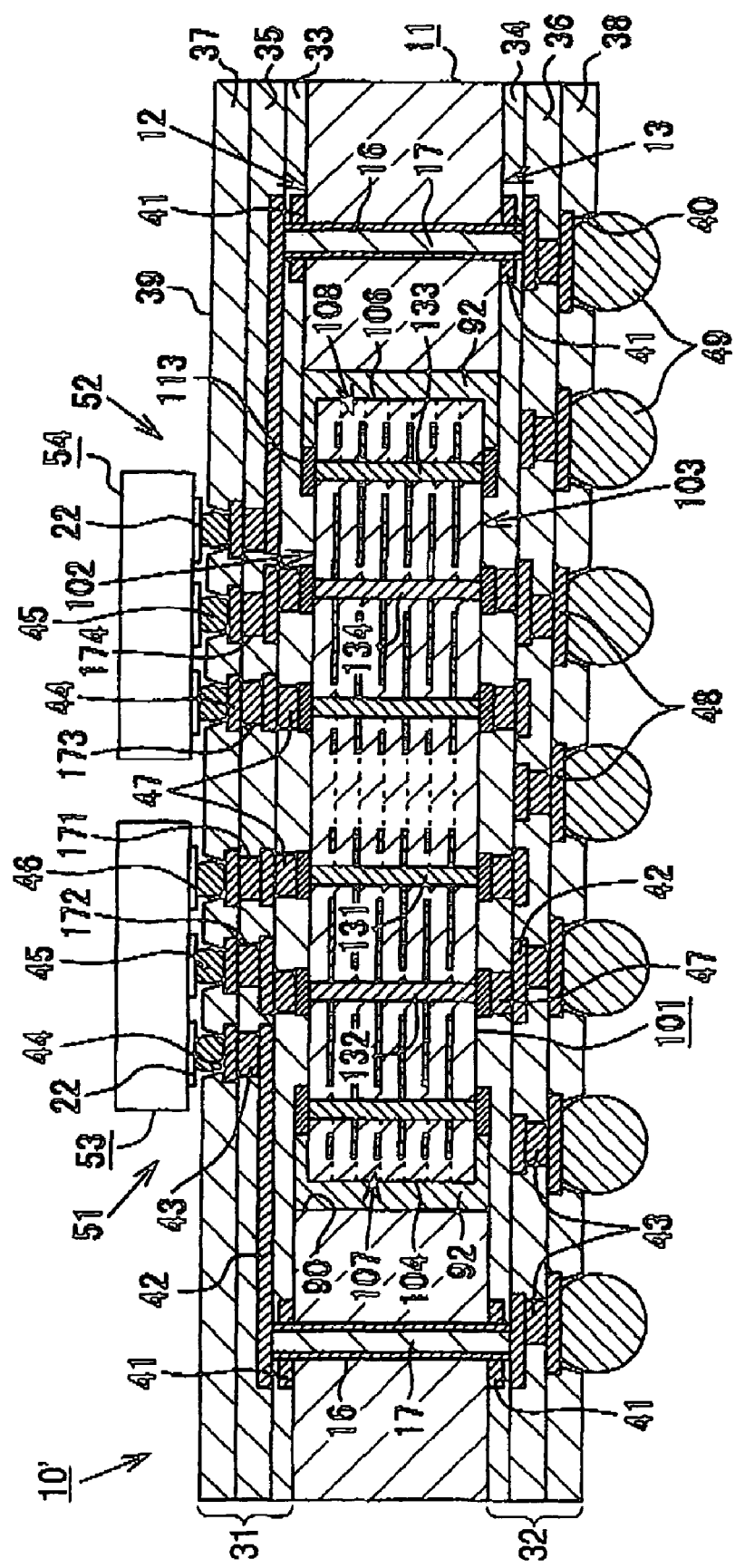
FIG. 8 is a schematic cross-sectional view illustrating a circuit board according to a second embodiment of the invention.

As shown in FIG. 8, a circuit board 10' according to the second embodiment has two IC chip mounting regions 51 and 52 (semiconductor integrated circuit device mounting regions) on the surface 39 of the first buildup layer 31. Instead of the IC chip 21 in the first embodiment, two IC chips 53 and 54 having only one processor core are mounted on the IC chip mounting regions 51 and 52, respectively.

A part of each first power-supply via conductor 131 constituting the capacitor function unit 107 is electrically connected to the corresponding surface connection terminal 22 of the IC chip 53 through the corresponding first power-supply electrode terminal 111 and the corresponding first power-supply conductor portion 171. A part of each first ground via conductor 132 constituting the capacitor function unit 107 is electrically connected to the corresponding surface connection terminal 22 of the IC chip 53 through the corresponding first ground electrode terminal 112 and the corresponding first ground conductor portion 172.

Similarly, a part of each second power-supply via conductor 133 constituting the capacitor function unit 108 is electrically connected to the corresponding surface connection terminal 22 of the IC chip 54 through the corresponding second power-supply electrode terminal 113 and the corresponding second power-supply conductor portion 173. A part of each second ground via conductor 134 constituting the capacitor function unit 108 is electrically connected to the corresponding surface connection terminal 22 of the IC chip 54 through the corresponding second ground electrode terminal 114 and the corresponding second ground conductor portion 174.

Accordingly, in the embodiment, even when two IC chips 53 and 54 cannot share a power supply system and different power supply systems should be provided to the respective IC chips 53 and 54, two capacitor function units 107 and 108 can be electrically connected to two IC chip mounting regions 51 and 52, respectively, thereby satisfactorily operating the respective IC chips 53 and 54. Accordingly, when a structure in which a plurality of IC chips 53 and 54 are mounted is used, the merit thereof can be drawn out to the maximum.

In addition, according to the structure described above, since the IC chips 53 and 54 are supported on one ceramic capacitor 101, it is easy to match up the thermal expansion coefficient with that of the IC chips 53 and 54, thereby reducing affection of the thermal stress. Accordingly, it is possible to prevent the cracks or the connection failures of the IC chips 53 and 54 resulting from the large thermal stress.

On the other hand, the embodiments of the invention may be modified as follows.

In the embodiment described above, the accommodating hole portion 90 is a through hole which is opened at the top surface 12 and the bottom surface 13. However, the accommodating hole portion 90 may be a recessed portion (non-through hole) with a bottom which is opened only at the top surface 12 of the board core 11.

Wiring patterns (inner patterns) may be formed in the board core 11 according to the embodiments. In this case, since complex electrical circuits may be formed in the circuit board 10, it is possible to further accomplish the enhancement in performance of the circuit board 10. The board core 11 may be formed by stacking a thin insulating layer on the core.

Figure 9:
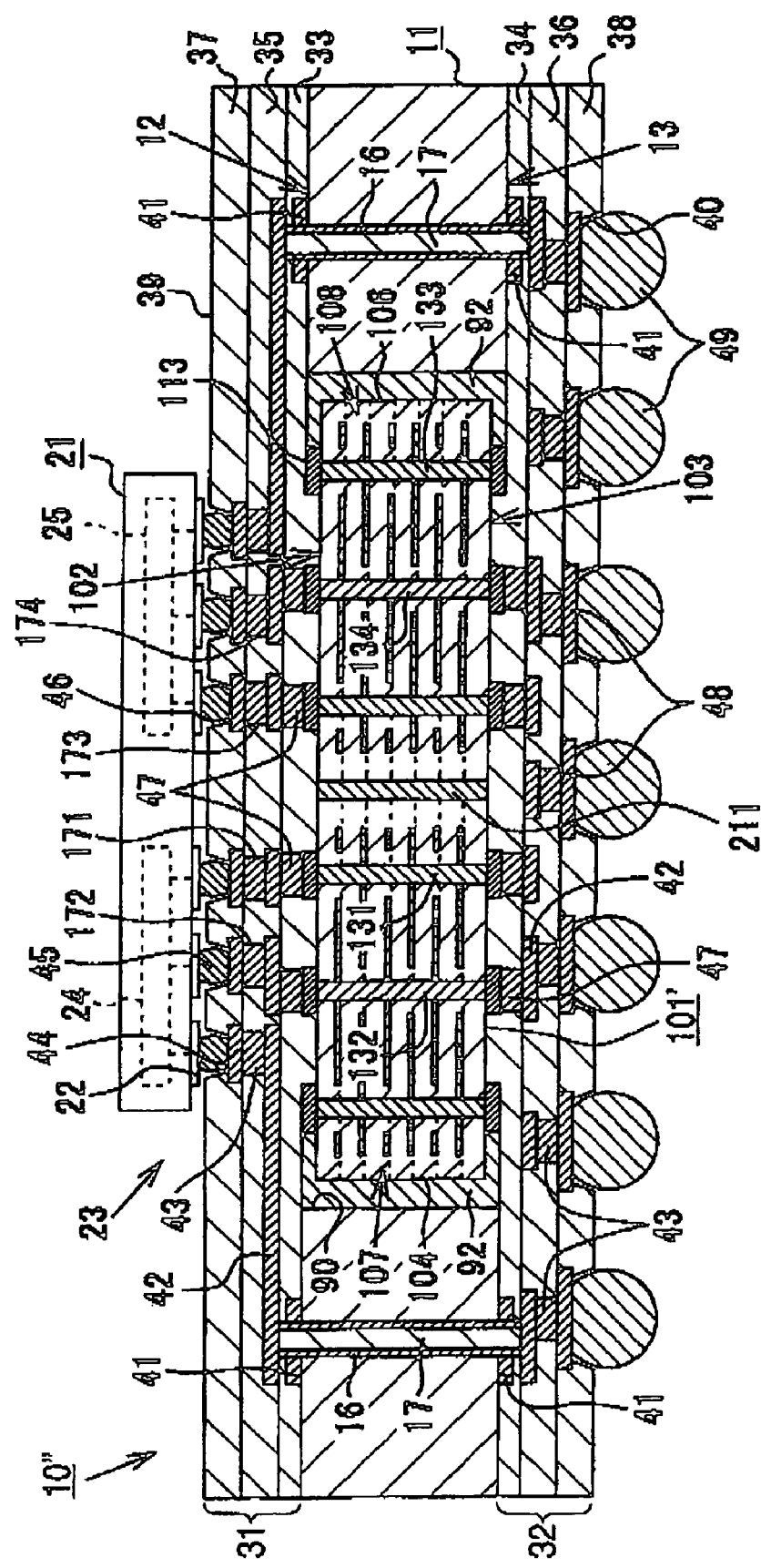
FIG. 9 is a schematic cross-sectional view illustrating a circuit board according to another embodiment of the invention.
Figure 10:
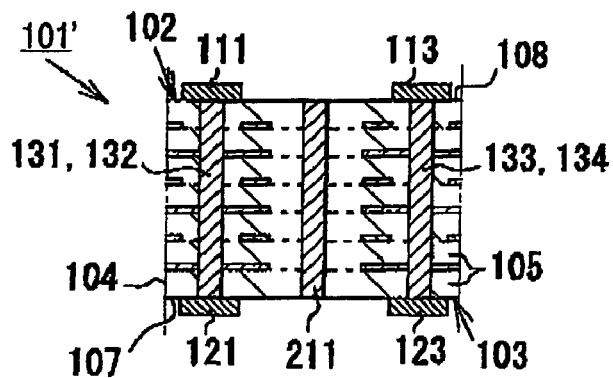
FIG. 10 is a schematic cross-sectional view illustrating a part of a circuit board according to another embodiment of the invention.
Figure 11:
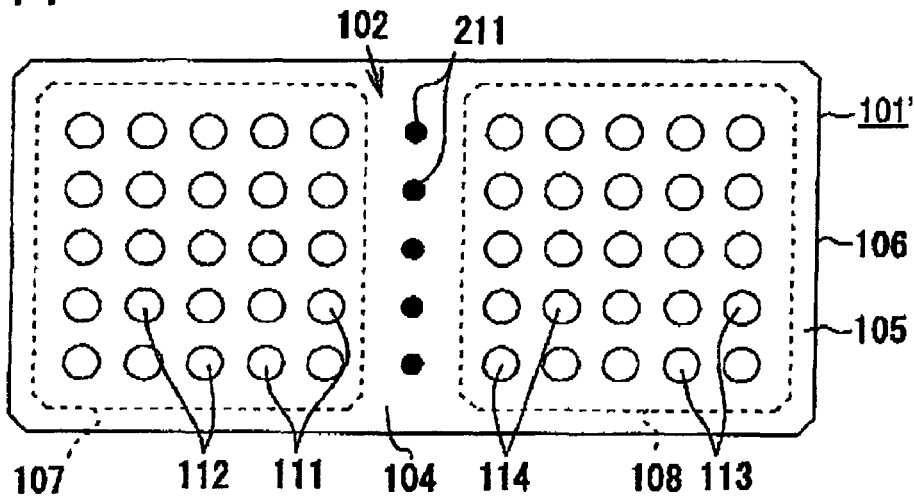
FIG. 11 is a schematic plan view illustrating a ceramic capacitor according to another embodiment of the invention.

In the embodiments, no structure is disposed in a space between the capacitor function units 107 and 108, but in another embodiment shown in FIGS. 9 to 11, a dummy conductor may be disposed in the corresponding space in order to accomplish the decrease in noise and enhancement in heat sinking ability between the capacitor function units 107 and 108. Specifically, a plurality of dummy via conductors 211 as the dummy conductor are linearly disposed parallel to the outer circumferential edges of the capacitor function units 107 and 108. In this modified example, the dummy via conductors 211 are formed at the same time as forming the via conductors 131, 132, 133 and 134 constituting the capacitor function units 107 and 108. Accordingly, the dummy via conductors 211 basically has the same structure as the via conductors 131, 132, 133, and 134 and contains nickel as a major component. However, the dummy via conductors 211 are not connected to any of the other conductors inside the ceramic capacitor 101 and the conductors outside the ceramic capacitor 101 and thus is electrically floated (see FIG. 9).

Figure 12:
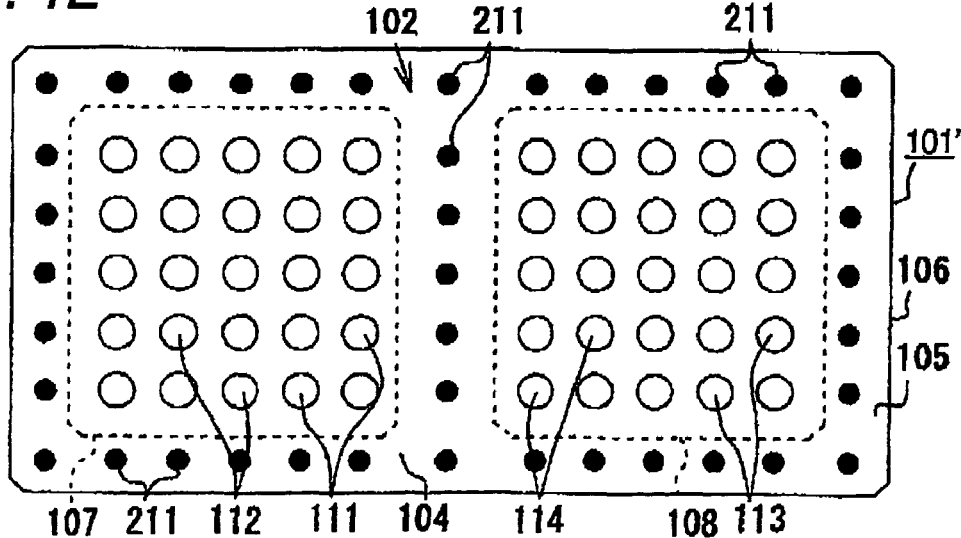
FIG. 12 is a schematic plan view illustrating a ceramic capacitor according to another embodiment of the invention.

In another embodiment shown in FIG. 12, the dummy via conductors 211 as the dummy conductor are disposed in the space between the capacitor function units 107 and 108 and surround two capacitor function units 107 and 108. Accordingly, according to this structure, it is possible to satisfactorily accomplish the decrease in noise and the enhancement in heat sinking ability.

Figure 13:
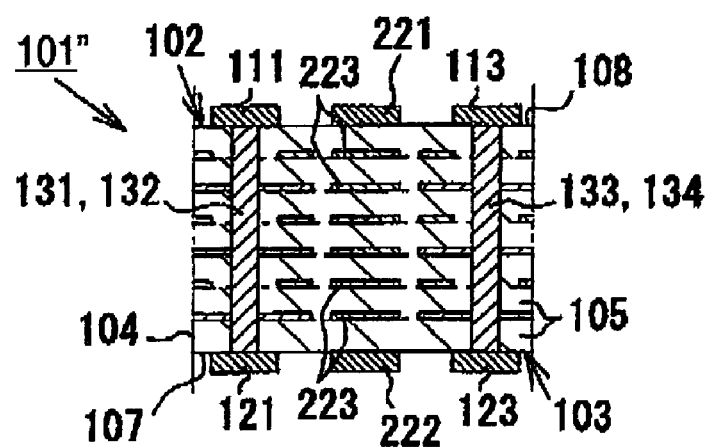
FIG. 13 is a schematic cross-sectional view illustrating a circuit board according to another embodiment of the invention.
Figure 14:
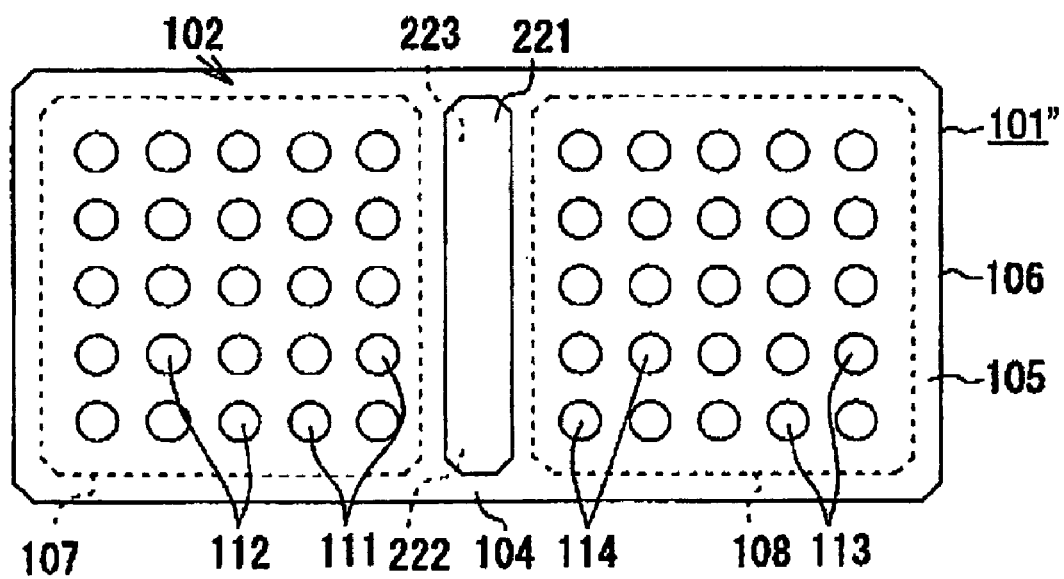
FIG. 14 is a schematic plan view illustrating a ceramic capacitor according to another embodiment of the invention.

In another embodiment shown in FIGS. 13 and 14, dummy conductors of a type different from ones described above are disposed in the space between the. capacitor function units 107 and 108. Specifically, dummy plain conductors 221, 222, and 223 having a substantially rectangular shape are disposed as the dummy conductor. A main-surface dummy plain conductor 221 disposed in the space on the main capacitor surface 102 basically has the same structure as the electrode terminals 111 to 114 and is formed by nickel as a major component with a copper plating layer. A rear-surface dummy plain conductor 222 disposed in the space on the rear capacitor surface 103 basically has the same structure as the electrode terminals 121 to 124 and is formed by nickel as a major component with a copper plating layer. An inner dummy plain conductor 223 disposed in the space inside the capacitor basically has the same structure as the inner electrode layers 141 and 142 and contains nickel as a major component. According to this structure, since the dummy plain conductors 221, 222, and 223 having a relatively large area are disposed in a plurality of layers, it is possible to obtain a suitable shielding effect, thereby satisfactorily decreasing the noise. Of course, the heat sinking ability is also enhanced. A structure in which the inner dummy plain conductor 223 is omitted or a structure in which the main-surface dummy plain conductor 221 and the rear-surface dummy plain conductor 222 are omitted may be employed. Here, the sizes and shapes of the dummy plain conductors 221, 222, and 223 are made equal to each other, but may be different from each other.

Figure 15:
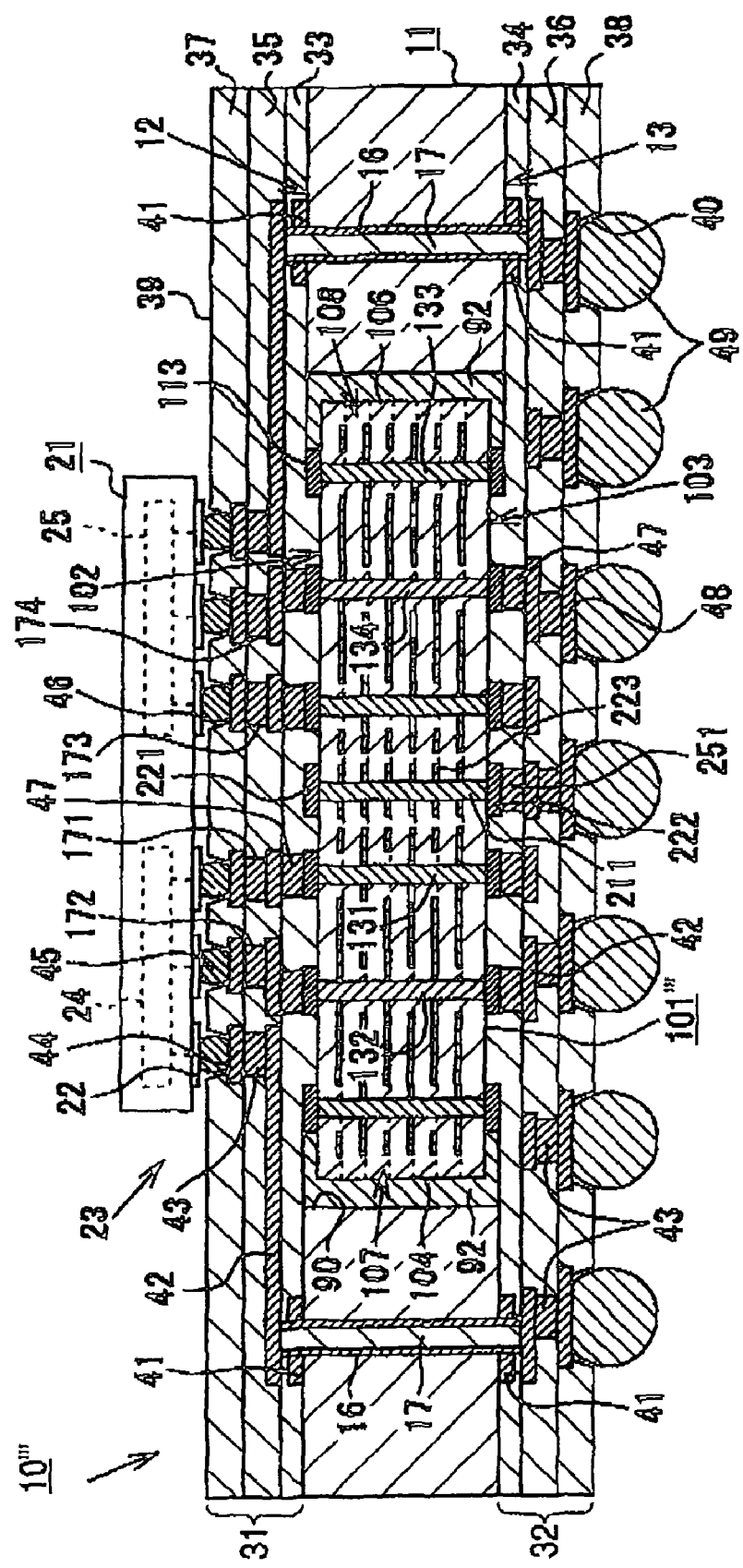
FIG. 15 is a schematic cross-sectional view illustrating a circuit board according to another embodiment of the invention.
Figure 16:
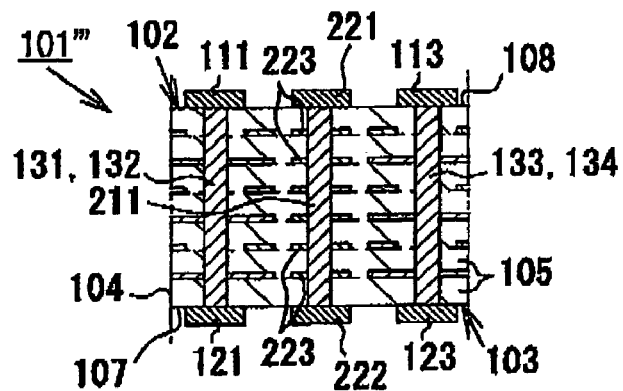
FIG. 16 is a schematic cross-sectional view illustrating a part of a circuit board according to another embodiment of the invention.
Figure 17:
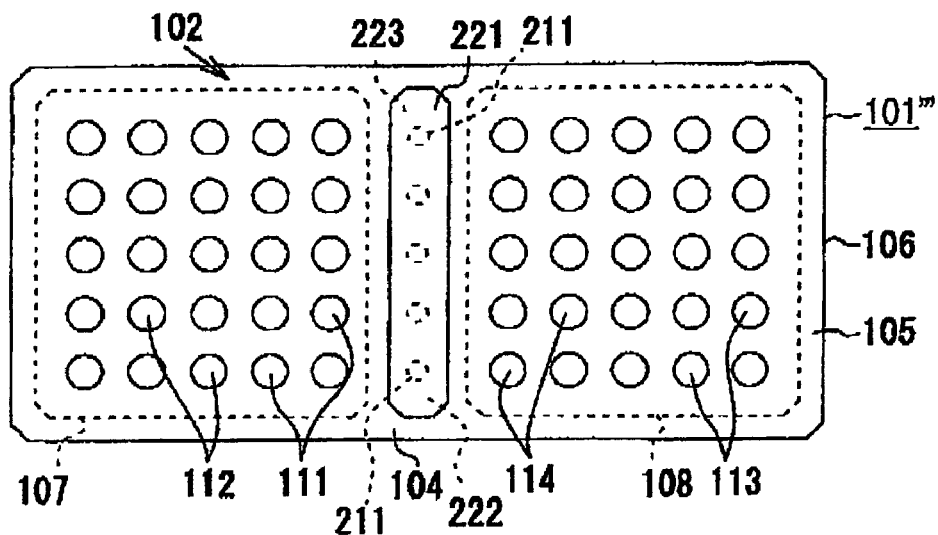
FIG. 17 is a schematic plan view illustrating a ceramic capacitor according to another embodiment of the invention.

Another embodiment shown in FIGS. 15, 16, and 17 has the structural features of the embodiment shown in FIGS. 9 to 11 and the structural features of the embodiment shown in FIGS. 13 and 14. That is, in this embodiment, the dummy via conductors 211 and the main-surface dummy plain conductors 221, the rear-surface dummy plain conductors 222, and the inner dummy plain conductors 223 connected to the dummy via conductors 211 are formed in the space between the capacitor function units 107 and 108. The rear-surface dummy plain conductors 222 are electrically connected to the ground layer of the buildup layer 32 through the conductors outside the ceramic capacitor 101''', that is, the via conductors 251 in the resin insulating layer 34. Accordingly, according to this structure, since a so-called three-dimensional shielding member is formed by means of the combination of the conductors having different shapes, the capacitor function units 107 and 108 are surely shielded from each other, thereby effectively reduce the noise. In addition, it is possible to satisfactorily enhance the beat sinking ability by connecting the dummy conductors to the ground layer outside the ceramic capacitor 101'''.

Figure 18:
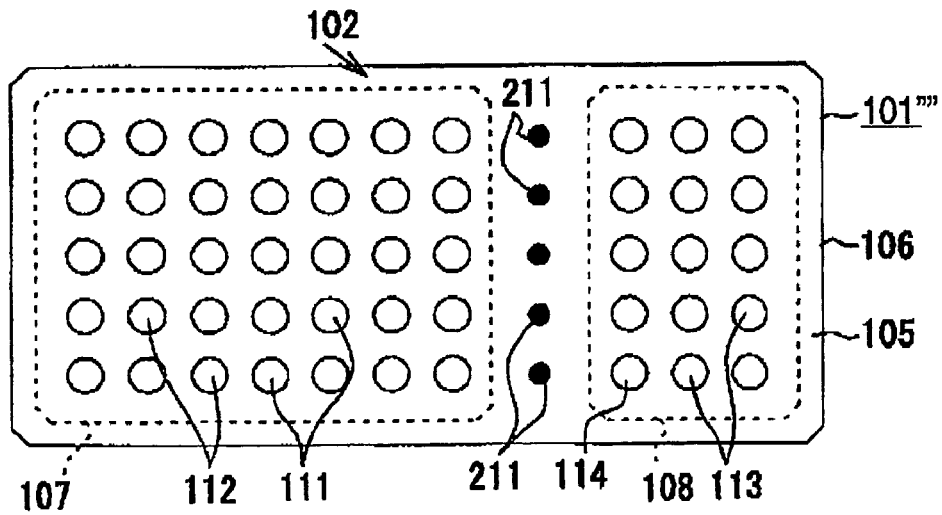
FIG. 18 is a schematic plan view illustrating a ceramic capacitor according to another embodiment of the invention.

In the embodiments described above, the sizes of the capacitor function units 107 and 108 as viewed in the plan view are equal to each other and thus the electrostatic capacities thereof are almost equal to each other. On the contrary, in another embodiment shown in FIG. 18, the sizes of the capacitor function units 107 and 108 as viewed in the plan view are different from each other. For example, the capacitor function unit 107 on the left side in the figure is a large-capacity part and the capacitor function unit 108 on the right side in the figure is a small capacity part. In this case, the small-capacity part can be easily affected by the large-capacity part and thus a noise can be easily generated due to the affection. However, in the embodiment, since the dummy conductors are interposed between the small-capacity part and the large-capacity part, it is possible to effectively reduce the noise in the small-capacity part.

Figure 19:
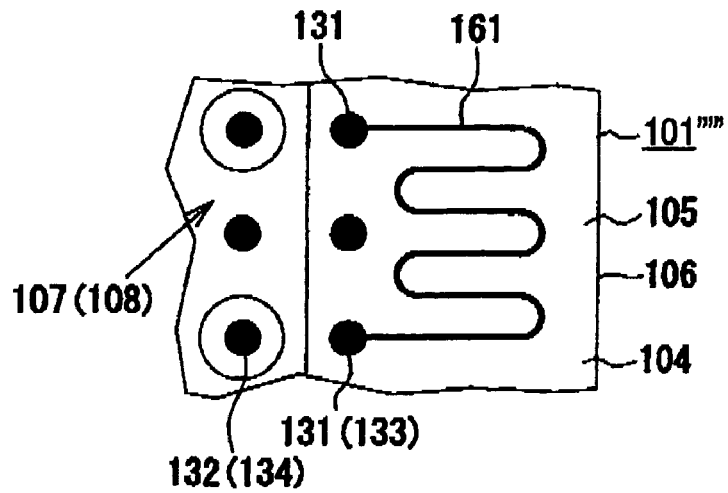
FIG. 19 is a schematic plan view illustrating a resistor and its periphery of a ceramic capacitor according to another embodiment of the invention.
Figure 20:
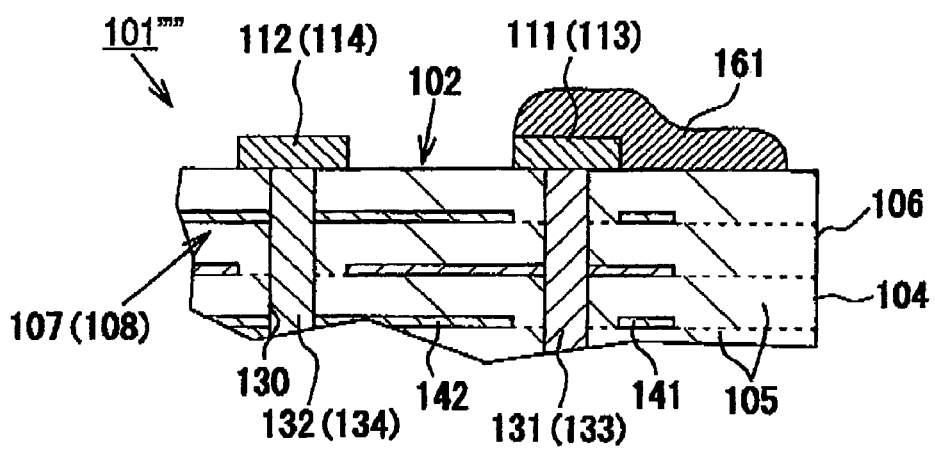
FIG. 20 is a schematic cross-sectional view illustrating a resistor and its periphery of a ceramic capacitor according to the embodiment of the invention.
Figure 21:
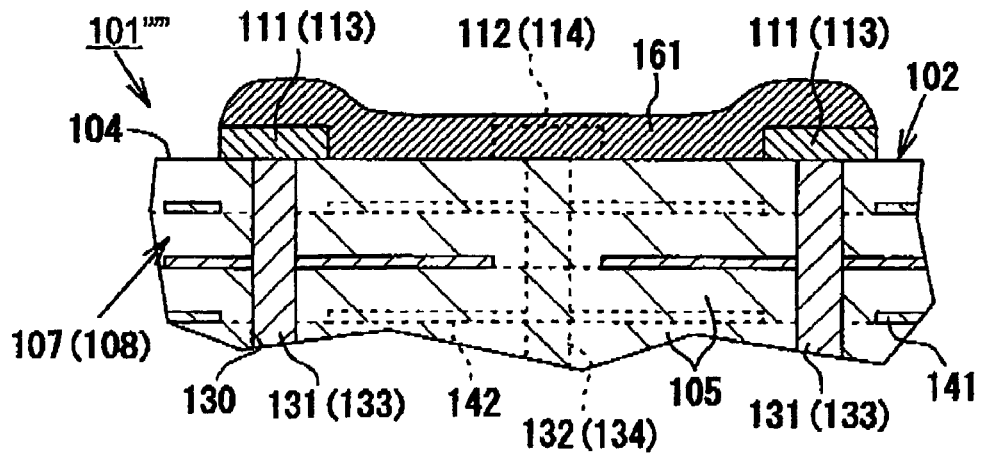
FIG. 21 is a schematic cross-sectional view illustrating a resistor and its periphery of a ceramic capacitor according to the embodiment of the invention.

As shown in FIGS. 19 to 21, a resistor 161 may be formed on the top surface 102 of the ceramic capacitor 101'''' and the like. For example, the resistor 161 electrically connects one first power-supply electrode terminal 111 (second power-supply electrode terminal 113) to another first power-supply electrode terminal 111 (second power-supply electrode terminal 113). The resistor 161 is made of ceramics having a resistance value higher than that of the material constituting the power-supply electrode terminals 111 and 113, the first inner electrode layer 141, and the second inner electrode layer 142. The proper resistor 161 is formed by completing the ceramic capacitor 101, then applying ceramic paste to the top surface 102, baking the ceramic paste for a predetermined time, removing unnecessary portions, and adjusting the resistance value thereof.

According to this structure, for example, it is possible to set different potentials in the ceramic capacitor 101'''', thereby easily accomplishing the enhancement in performance of the circuit board. When the resistor 161 is not formed in the ceramic capacitor, the resistor should be buried at a position of the board core other than the ceramic capacitor or the resistor should be disposed on the side of the buildup layers 31 and 32.

A plurality of dummy via electrodes (ground via electrodes) may be disposed between the capacitor function units 107 and 108. According to this structure, it is possible to reduce the noise due to the interference between the capacitor function unit 107 and the capacitor function unit 108. Specifically, when the capacitor function units 107 and 108 include a large-capacity part and a small-capacity part, a plurality of dummy via electrodes (ground via electrodes) may be disposed between the large-capacity part and the small-capacity part. In this case, it is possible to reduce the noise of the small-capacity part which is easily affected by the large-capacity part. In consideration of the heat sinking ability, a plurality of dummy via electrodes (ground via electrodes) may be disposed at positions surrounding the capacitor function units 107 and 108.

Figure 22:
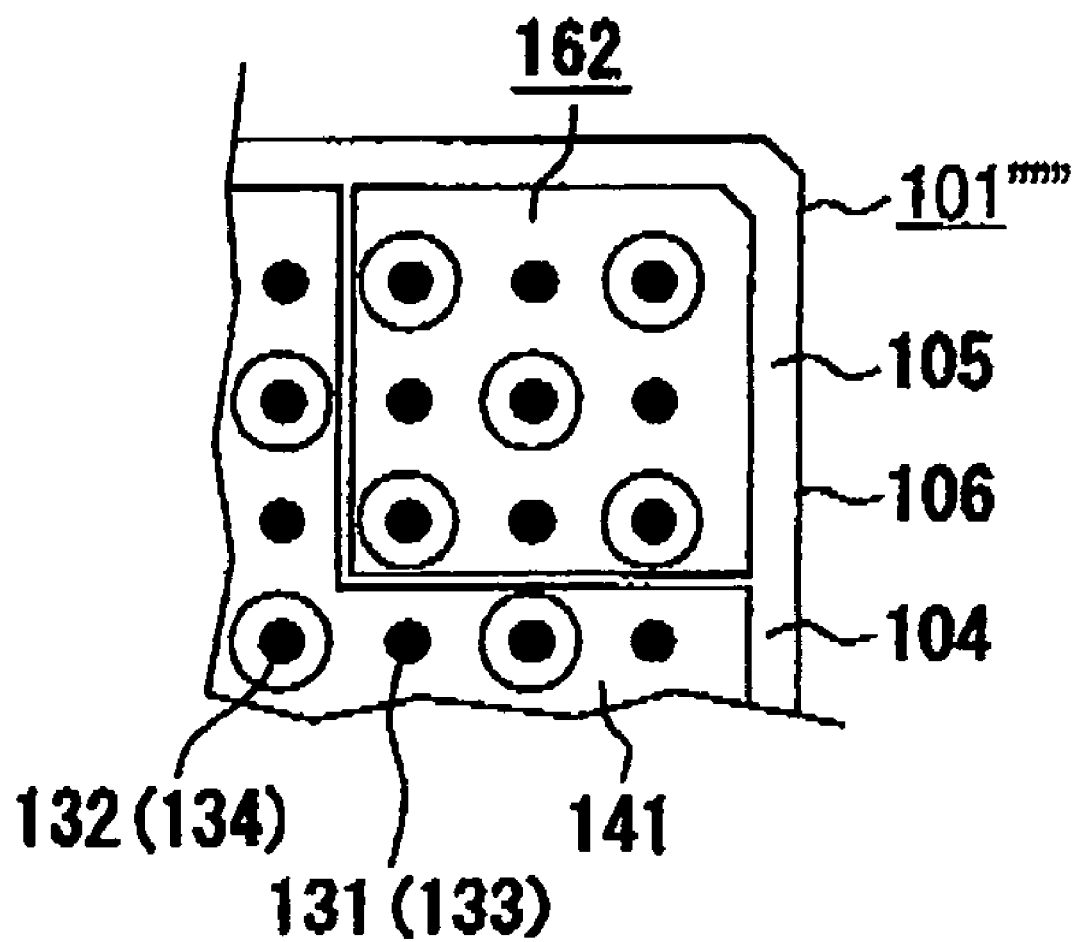
FIG. 22 is a schematic plan view illustrating a capacitor and its periphery of a ceramic capacitor according to another embodiment of the invention.

As shown in FIG. 22, a capacitor unit 162 (extra-system function unit) having a system (for supply an electric power to I/O) different from that of the IC chip 21 may be disposed in a part of the ceramic capacitor 101'''''. In this case, it is possible to further accomplish the enhancement in performance of the circuit board. In this modified example, the capacitor unit 162 for supplying an electric power to the I/O has a capacity smaller than that of the capacitor unit for supplying an electric power to a CPU (IC chip 21).

Next, technical spirits derived from the above-mentioned embodiments will be described below.

(1) A circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, and having a plurality of capacitor function units electrically independent of each other, the ceramic capacitor being buried in the board core in a state where the main core surface and the main capacitor surface are directed in the same direction; and a buildup layer having a structure in which an interlayer insulating layer and a conductor layer are alternately stacked on the main core surface and the main capacitor surface and having a semiconductor integrated circuit device mounting region, which can be mounted with a semiconductor integrated circuit device having a plurality of processor cores, set on the surface thereof, wherein the ceramic capacitor is disposed in a region corresponding to the semiconductor integrated circuit device mounting region in the core board and the plurality of capacitor function units can be electrically connected to the plurality of processor cores, respectively.

(2) A circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, and having a plurality of capacitor function units electrically independent of each other, the ceramic capacitor being buried in the board core in a state where the main core surface and the main capacitor surface are directed in the same direction; a first buildup layer having a structure in which an interlayer insulating layer and a conductor layer are alternately stacked on the main core surface and the main capacitor surface and having a semiconductor integrated circuit device mounting region, which can be mounted with a semiconductor integrated circuit device having a plurality of processor cores, set on the surface thereof; and a second buildup layer having a structure in which an interlayer insulating layer and a conductor layer are alternately stacked on the rear core surface and the rear capacitor surface, wherein the ceramic capacitor is disposed in a region corresponding to the semiconductor integrated circuit device mounting region in the core board and the plurality of capacitor function units can be electrically connected to the plurality of processor cores, respectively.

(3) A circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, and having a capacitor function unit including an extra-system function unit, the ceramic capacitor being buried in the board core in a state where the main core surface and the main capacitor surface are directed in the same direction; and a buildup layer having a structure in which an interlayer insulating layer and a conductor layer are alternately stacked on the main core surface and the main capacitor surface and having a semiconductor integrated circuit device mounting region, which can be mounted with a semiconductor integrated circuit device having a plurality of processor cores, set on the surface thereof, wherein the plurality of capacitor function units can be electrically connected to the plurality of processor cores, respectively.

(4) A circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, having a plurality of capacitor function units electrically independent of each other, and having a plurality of power-supply via conductors electrically connecting the first inner electrode layers to each other and a plurality of ground via conductors electrically connecting the second inner electrode layers to each other, in which the plurality of power-supply via conductors and the plurality of ground via conductors are arranged in an array as a whole, the ceramic capacitor being buried in the board core in a state where the main core surface and the main capacitor surface are directed in the same direction; and a buildup layer having a structure in which an interlayer insulating layer and a conductor layer are alternately stacked on the main core surface and the main capacitor surface and having a plurality of semiconductor integrated circuit device mounting regions set at different positions on the surface thereof, wherein the plurality of capacitor function units can be electrically connected to the plurality of processor cores, respectively.

(5) The circuit board according to (4), further comprising power-supply electrode terminals disposed at ends of the plurality of power-supply via conductors close to the main capacitor surface and ground electrode terminals disposed at ends of the plurality of ground via conductors close to the main capacitor surface.

(6) The circuit board according to (4) or (5), wherein the plurality of power-supply via conductors and the plurality of ground via conductors connects the main capacitor surface to the rear capacitor surface. Accordingly, according to the technical spirit (6), it is easy to accomplish the decrease in size of the ceramic capacitor and also to accomplish the decrease in size of the circuit board as a whole.

(7) A circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, and having a plurality of capacitor function units electrically independent of each other, the ceramic capacitor being buried in the board core in a state where the main core surface and the main capacitor surface are directed in the same direction; a buildup layer having a structure in which an interlayer insulating layer and a conductor layer are alternately stacked on the main core surface and the main capacitor surface and having a semiconductor integrated circuit device mounting region, which can be mounted with a semiconductor integrated circuit device having a plurality of processor cores, set on the surface thereof; and the semiconductor integrated circuit device, wherein the plurality of processor cores and the plurality of capacitor function units can be electrically connected to each other through conductor portions of the buildup layer, respectively.

Third Embodiment

Hereinafter, a circuit board according to a third embodiment of the invention will be described in detail with reference to the drawings.

Figure 5:
FIG. 5 is an explanatory diagram illustrating a method of manufacturing the circuit board according to the first embodiment of the invention.
Figure 6:
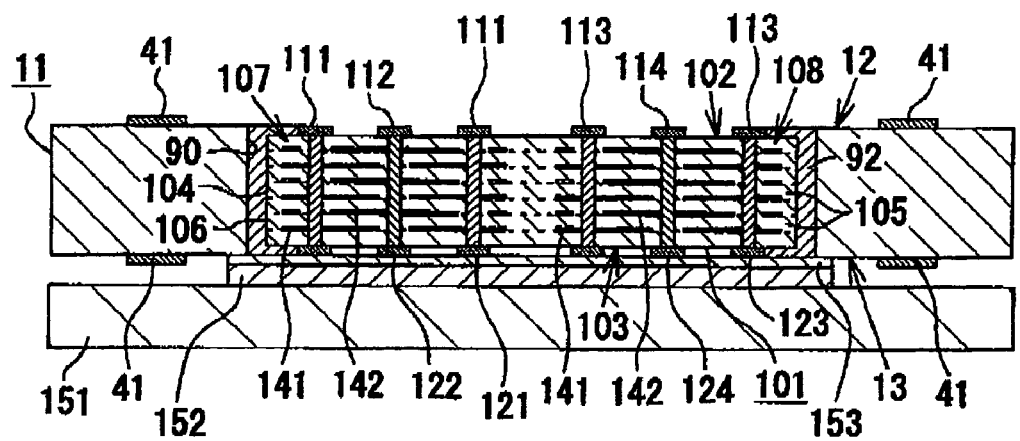
FIG. 6 is an explanatory diagram illustrating a method of manufacturing the circuit board according to the first embodiment of the invention.
Figure 7:
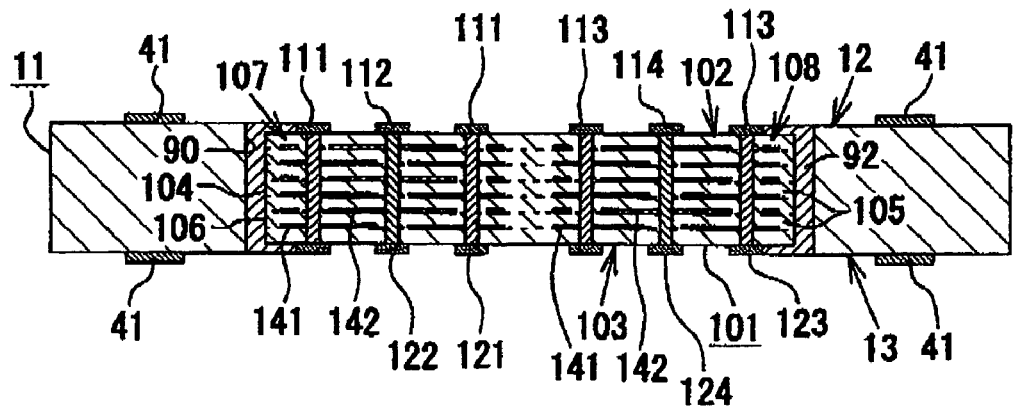
FIG. 7 is an explanatory diagram illustrating a method of manufacturing the circuit board according to the first embodiment of the invention.
Figure 23:
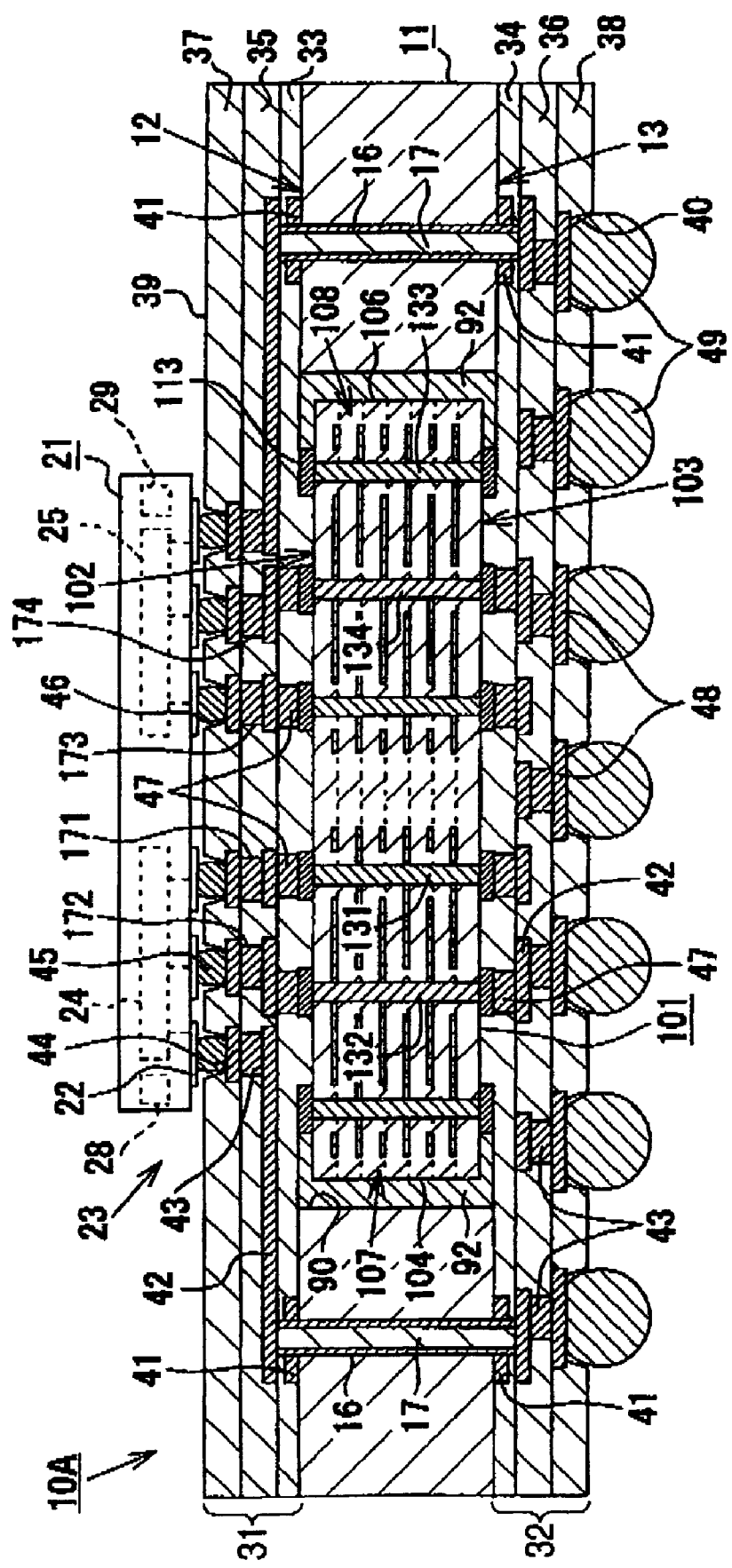
FIG. 23 is a schematic cross-sectional view illustrating a circuit board according to a third embodiment of the invention.

FIG. 23 illustrates a circuit board 10A according to the third embodiment, which is different from the circuit board 10 according to the first embodiment shown in FIG. 1 in that the IC chip 21 has two I/O circuit units 28 and 29, in addition to two processor cores 24 and 25. FIGS. 2 to 4 illustrating the ceramic capacitor 101 and the details thereof and FIGS. 5 to 7 illustrating the manufacturing method and the details thereof are adapted to the ceramic capacitor 101A according to the third embodiment, which is different from the ceramic capacitor 101 according to the first embodiment in that the following facts.

Figure 24:
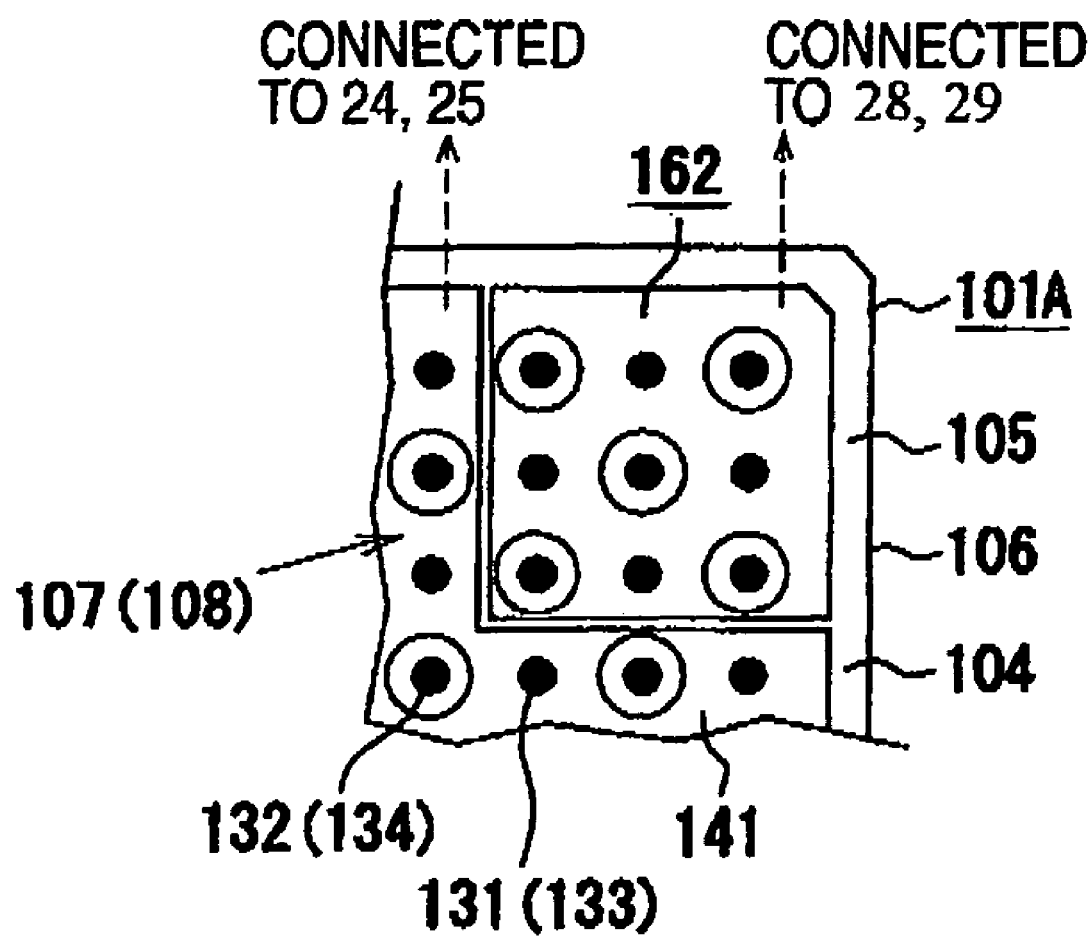
FIG. 24 is a schematic cross-sectional view illustrating a ceramic capacitor according to a modified example of the third embodiment.

FIG. 24 illustrates the ceramic capacitor 101A according to the third embodiment. In the ceramic capacitor 101A according to the embodiment, an extra-system capacitor function unit 162 (for supplying an electrical power to the I/O circuit units 28 and 29) with an extra system different from that of the processor cores 24 and 25 of the IC chip 21. The capacitor function units 107 and 108 are electrically connected to the processor cores 24 and 25, respectively, and the extra-system capacitor function units 162 is electrically connected to the I/O circuit units 28 and 29. By performing the electrical connections in this way, it is possible to satisfactorily operate both of the processor cores 24 and 25 and the I/O circuit units 28 and 29, thereby drawing out the ability of the IC chip 21 to the maximum. Accordingly, it is possible to further accomplish the enhancement in performance of the circuit board 10A. In the embodiment, the capacitor function unit 162 for supplying an electric power to the I/O circuit units 28 and 29 has a capacity smaller than that of the capacitor function units 107 and 108 for supplying an electric power to the CPU (processor cores 24 and 25).

Fourth Embodiment

Hereinafter, a circuit board according to a fourth embodiment of the invention will be described in detail with reference to the drawings.

Figure 25:
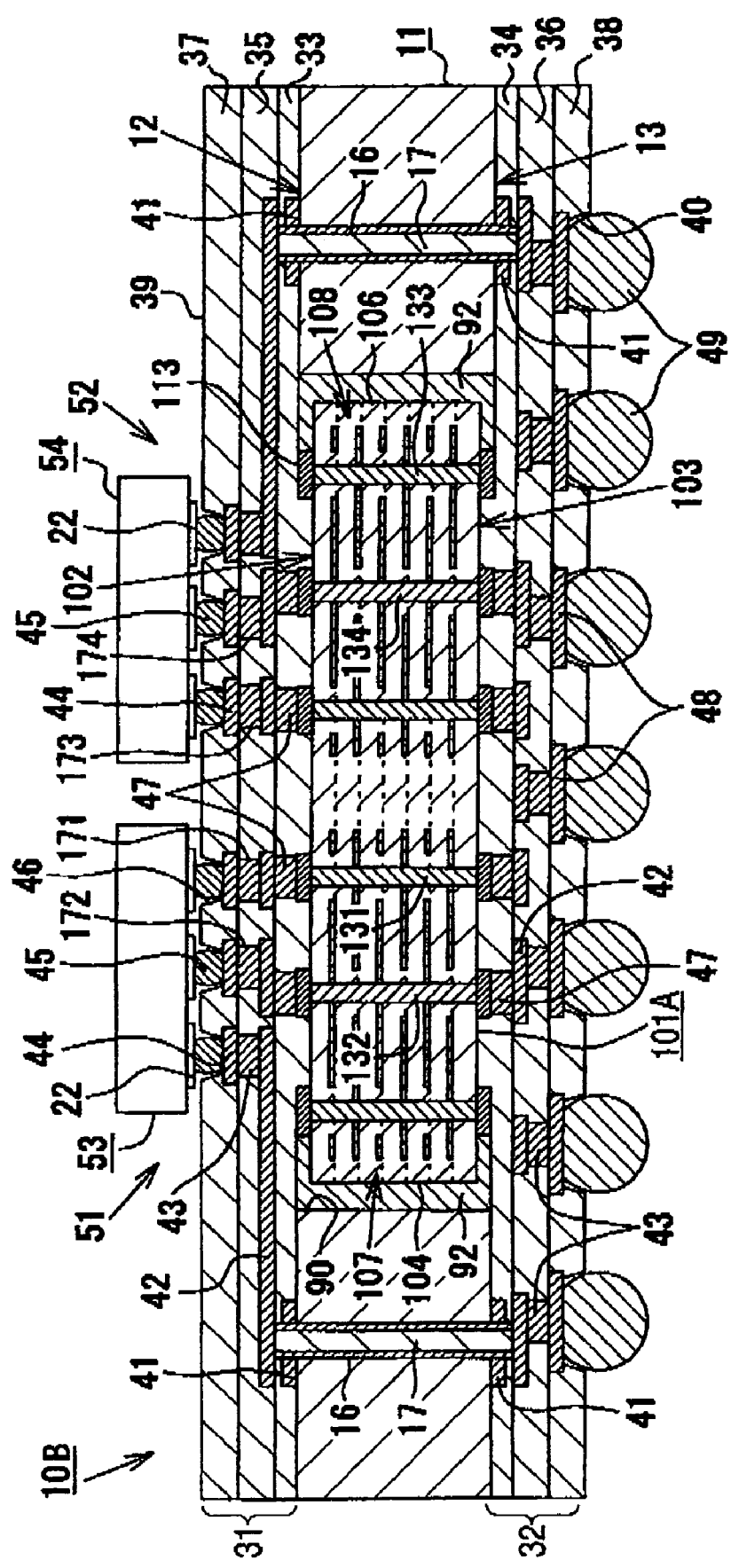
FIG. 25 is a schematic cross-sectional view illustrating a circuit board according to a fourth embodiment of the invention.

As shown in FIG. 25, the circuit board 10B according to the fourth embodiment has two IC chip mounting regions 51 and 52 (semiconductor integrated circuit device mounting regions) on the surface 39 of the first buildup layer 31. Instead of the IC chip 21 according to the third embodiment, two IC chips 53 and 54 having one processor core are mounted on the IC chip mounting regions 51 and 52, respectively.

A part of each first power-supply via conductor 131 constituting the capacitor function unit 107 is electrically connected to the corresponding surface connection terminal 22 of the IC chip 53 through the corresponding first power-supply electrode terminal 111 and the corresponding first power-supply conductor portion 171. A part of each first ground via conductor 132 constituting the capacitor function unit 107 is electrically connected to the corresponding surface connection terminal 22 of the IC chip 53 through the corresponding first ground electrode terminal 112 and the corresponding first ground conductor portion 172.

Similarly, a part of each second power-supply via conductor 133 constituting the capacitor function unit 108 is electrically connected to the corresponding surface connection terminal 22 of the IC chip 54 through the corresponding second power-supply electrode terminal 113 and the corresponding second power-supply conductor portion 173. A part of each second ground via conductor 134 constituting the capacitor function unit 108 is electrically connected to the corresponding surface connection terminal 22 of the IC chip 54 through the corresponding second ground electrode terminal 114 and the corresponding second ground conductor portion 174.

Accordingly, in the embodiment, even when two IC chips 53 and 54 cannot share a power supply system and different power supply systems should be provided to the respective IC chips 53 and 54, two capacitor function units 107 and 108 can be electrically connected to two IC chip mounting regions 51 and 52, respectively, thereby satisfactorily operating the respective IC chips 53 and 54. Accordingly, when a structure in which a plurality of IC chips 53 and 54 are mounted is empolyed, the merit thereof can be drawn out to the maximum.

In addition, according to the structure described above, since the IC chips 53 and 54 are supported on one ceramic capacitor 101A, it is easy to match up the thermal expansion coefficient with that of the IC chips 53 and 54, thereby reducing affection of the thermal stress. Accordingly, it is possible to prevent the cracks or the connection failures of the IC chips 53 and 54 resulting from the large thermal stress.

On the other hand, the embodiments of the invention may be modified as follows.

In the third and fourth embodiments described above, the accommodating hole portion 90 is a through hole which is opened at the top surface 12 and the bottom surface 13. However, the accommodating hole portion 90 may be a recessed portion (non-through hole) with a bottom which is opened only at the top surface 12 of the board core 11.

Wiring patterns (inner patterns) may be formed in the board core 11 according to the third and fourth embodiments. In this case, since complex electrical circuits may be formed in the circuit boards 10A and 10B, it is possible to further accomplish the enhancement in performance of the circuit board. The board core 11 may be formed by stacking a thin insulating layer on the core.

Figure 26:
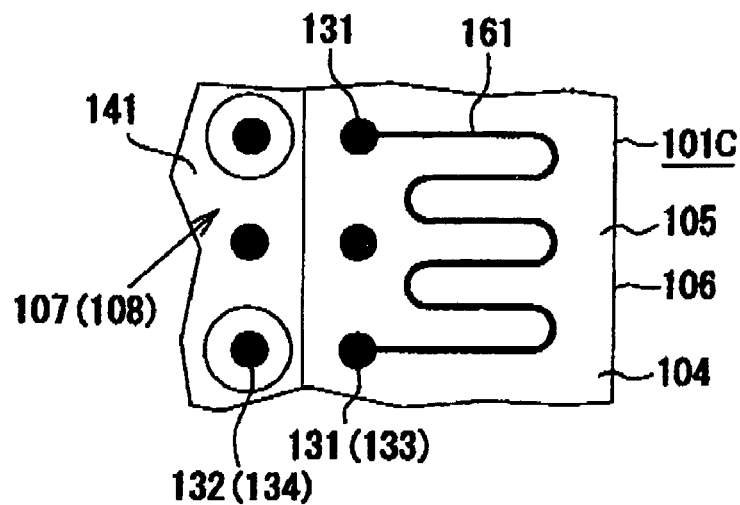
FIG. 26 is a schematic plan view illustrating a resistor and its periphery of a ceramic capacitor according to another embodiment of the invention.
Figure 27:
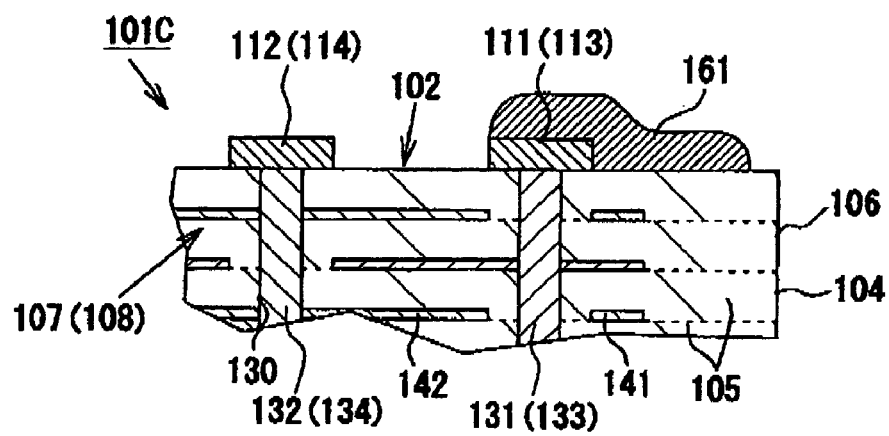
FIG. 27 is a schematic plan view illustrating a resistor and its periphery of a ceramic capacitor according to the embodiment of the invention.
Figure 28:
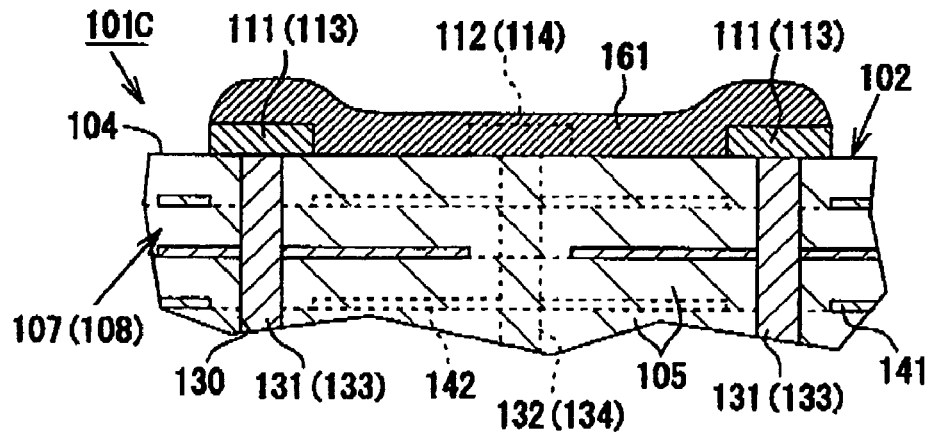
FIG. 28 is a schematic plan view illustrating a resistor and its periphery of a ceramic capacitor according to the embodiment of the invention.

As shown in FIGS. 26 to 28, a resistor 161 may be formed on the top surface 102 of the ceramic capacitor 101C and the like. For example, the resistor 161 electrically connects one first power-supply electrode terminal 111 (second power-supply electrode terminal 113) to another first power-supply electrode terminal 111 (second power-supply electrode terminal 113). The resistor 161 is made of ceramics having a resistance value higher than that of the material constituting the power-supply electrode terminals 111 and 113, the first inner electrode layer 141, and the second inner electrode layer 142. The proper resistor 161 is formed by completing the ceramic capacitor 101C, then applying ceramic paste to the top surface 102, baking the ceramic paste for a predetermined time, removing unnecessary portions, and adjusting the resistance value thereof.

According to this structure, for example, it is possible to set different potentials in the ceramic capacitor 101C, thereby easily accomplishing the enhancement in performance of the circuit board. When the resistor 161 is not formed in the ceramic capacitor 101C, the resistor should be buried at a position in the board core other than the ceramic capacitor 101C or the resistor should be disposed on the side of the buildup layers 31 and 32.

A plurality of dummy via electrodes (ground via electrodes) may be disposed between the capacitor function units 107 and 108. According to this structure, it is possible to reduce the noise due to the interference between the capacitor function unit 107 and the capacitor function unit 108. Specifically, when the capacitor function units 107 and 108 include a large-capacity part and a small-capacity part, a plurality of dummy via electrodes (ground via electrodes) may be disposed between the large-capacity part and the small-capacity part. In this case, it is possible to reduce the noise of the small-capacity part which is easily affected by the large-capacity part. In consideration of the heat sinking ability, a plurality of dummy via electrodes (ground via electrodes) may be disposed at positions surrounding the capacitor function units 107 and 108.

Next, technical spirits derived from the above-mentioned embodiments will be described as follows.

(1) A circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, and having a capacitor function unit and a first extra-system capacitor function unit and a second extra-system capacitor function unit having a capacity smaller than that of the capacitor function unit, the ceramic capacitor being buried in the board core in a state where the main core surface and the main capacitor surface are directed in the same direction; and a buildup layer having a structure in which an interlayer insulating layer and a conductor layer are alternately stacked on the main core surface and the main capacitor surface and having a semiconductor integrated circuit device mounting region, which can be mounted with a semiconductor integrated circuit device having a processor core and an I/O circuit unit, set on the surface thereof, wherein the first extra-system capacitor function unit can be electrically connected to an input circuit constituting the I/O circuit unit and the second extra-system capacitor function unit can be electrically connected to an output circuit constituting the I/O circuit unit, (2) A circuit board comprising: a board core having a main core surface and a rear core surface; a ceramic capacitor having a main capacitor surface and a rear capacitor surface, having a structure in which a first inner electrode layer and a second inner electrode layer are alternately stacked with a ceramic dielectric layer interposed therebetween, and having a capacitor function unit and an extra-system capacitor function unit having a capacity smaller than that of the capacitor function unit, the ceramic capacitor being buried in the board core in a state where the main core surface and the main capacitor surface are directed in the same direction; and a buildup layer having a structure in which an interlayer insulating layer and a conductor layer are alternately stacked on the main core surface and the main capacitor surface and having a semiconductor integrated circuit device mounting region, which can be mounted with a semiconductor integrated circuit device having a first circuit unit and a second circuit unit operating at a frequency lower than that of the first circuit unit, set on the surface thereof, wherein the capacitor function unit can be electrically connected to the first circuit unit and the extra-system capacitor function unit can be electrically connected to the second circuit unit.

This application is based on Japanese Patent application JP 2005-254030, filed Sep. 1, 2005, and Japanese Patent application JP 2006-112261, filed Apr. 14, 2006, the entire contents of which are hereby incorporated by reference, the same as if set forth at length.

What is claimed is:

1. A circuit board comprising:
    a board core having a main core surface and a rear core surface;
    a ceramic capacitor having a main capacitor surface and a rear capacitor surface, having a structure in which a first inner electrode layer and a second inner electrode layer are alternately stacked with a ceramic dielectric layer interposed therebetween, and having a plurality of capacitor function units being electrically independent from each other, the ceramic capacitor being buried in the board core in a state where the main core surface and the main capacitor surface are directed in a same direction; and
    a buildup layer having a structure in which an interlayer insulating layer and a conductor layer are alternately stacked on the main core surface and the main capacitor surface and having a semiconductor integrated circuit device mounting region for mounting a semiconductor integrated circuit device having a plurality of processor cores on a surface of the buildup layer,
    wherein the plurality of capacitor function units are capable of being electrically connected to the plurality of processor cores, respectively, and
    wherein terminal pads formed on the semiconductor integrated circuit device mounting region are electrically connected to respective ones of the plurality of capacitor function units, respective ones of the plurality of capacitor function units being electrically connected to a corresponding one of the plurality of processor cores through a corresponding one of the terminal pads.

2. The circuit board according to claim 1, wherein the buildup layer has a plurality of power supply conductor portions electrically independent from each other and the plurality of capacitor function units are electrically connected to the plurality of processor cores through the plurality of power supply conductor portions, respectively.

3. The circuit board according to claim 1, wherein an area of the semiconductor integrated circuit device mounting region is equal to or smaller than an area of the main capacitor surface of the ceramic capacitor, and
    the semiconductor integrated circuit device mounting region is located in the main capacitor surface of the ceramic capacitor as viewed in a thickness direction of the ceramic capacitor.

4. The circuit board according to claim 1, wherein the buildup layer is a first buildup layer, and the circuit board further comprises a second buildup layer having a structure in which an interlayer insulating layer and a conductor layer are alternately stacked on the rear core surface and the rear capacitor surface.

5. The circuit board according to claim 1, wherein the plurality of capacitor function units includes a first capacitor function unit having a first capacity and a second capacitor function unit having a second capacity smaller than the first capacity.

6. The circuit board according to claim 1, wherein a dummy conductor is provided between the plurality of capacitor function units.

7. The circuit board according to claim 1, wherein a dummy conductor is provided to surround the plurality of capacitor function units.

8. The circuit board according to claim 6, wherein the dummy conductor includes a plurality of dummy via conductors penetrating through the main capacitor surface and the rear capacitor surface.

9. The circuit board according to claim 6, wherein the dummy conductor includes at least one of: a dummy plain conductor provided on the main capacitor surface, a dummy plain conductor provided on the rear capacitor surface and a dummy plain conductor provided within the ceramic capacitor.

10. The circuit board according to claim 6, wherein the dummy conductor includes a combination of a plurality of dummy via conductors penetrating through the main capacitor surface and the rear capacitor surface, a main dummy plain conductor provided on the main capacitor surface and connected to the plurality of dummy via conductors, a rear dummy plain conductor provided on the rear capacitor surface and connected to the plurality of dummy via conductors, and an inner dummy plain conductor provided within the ceramic capacitor and connected to the plurality of dummy via conductors.

* * * * *